(12) United States Patent
Sugawara et al.

(10) Patent No.: US 7,978,739 B2
(45) Date of Patent: Jul. 12, 2011

(54) SURFACE EMITTING LASER ELEMENT, SURFACE EMITTING LASER ARRAY, OPTICAL SCANNING DEVICE, AND IMAGE FORMING APPARATUS

(75) Inventors: Satoru Sugawara, Miyagi (JP); Toshihiro Ishii, Miyagi (JP); Kazuhiro Harasaka, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 79 days.

(21) Appl. No.: 12/481,080

(22) Filed: Jun. 9, 2009

(65) Prior Publication Data

US 2009/0310632 A1    Dec. 17, 2009

(30) Foreign Application Priority Data

Jun. 11, 2008  (JP) .................................. 2008-153382
Apr. 7, 2009   (JP) .................................. 2009-092551

(51) Int. Cl.
*H01S 3/10* (2006.01)
*H01S 5/00* (2006.01)

(52) U.S. Cl. ................. 372/24; 372/50.124; 372/50.11; 372/45.011; 372/45.01

(58) Field of Classification Search .................... 372/24, 372/50.124, 50.11, 45.01, 44.011
See application file for complete search history.

(56) References Cited

U.S. PATENT DOCUMENTS

| | | | |
|---|---|---|---|
| 5,331,654 A | 7/1994 | Jewell et al. | |
| 5,357,123 A | 10/1994 | Sugawara | |
| 5,412,680 A | 5/1995 | Swirhun et al. | |
| 5,727,014 A * | 3/1998 | Wang et al. | ..................... 372/96 |
| 6,975,663 B2 | 12/2005 | Sekiya et al. | |
| 7,002,527 B2 | 2/2006 | Sugawara | |
| 7,245,647 B2 | 7/2007 | Jikutani et al. | |
| 2003/0039294 A1 | 2/2003 | Ueki et al. | |
| 2006/0093010 A1 | 5/2006 | Sekiya et al. | |
| 2006/0220002 A1 * | 10/2006 | Ohgoh | ............................ 257/14 |
| 2007/0211325 A1 * | 9/2007 | Ichii | .............................. 359/216 |
| 2008/0212636 A1 | 9/2008 | Sato et al. | |
| 2009/0262770 A1 | 10/2009 | Itoh et al. | |
| 2010/0118907 A1 | 5/2010 | Sato et al. | |

FOREIGN PATENT DOCUMENTS

| | | |
|---|---|---|
| EP | 1780849 A1 | 5/2007 |
| JP | 9-172218 | 6/1997 |
| JP | 2891133 | 2/1999 |
| JP | 3262765 | 12/2001 |
| JP | 4010095 | 9/2007 |
| JP | 2008-28424 | 2/2008 |
| JP | 2008-78612 | 4/2008 |
| WO | WO2008/026460 A1 | 3/2008 |

OTHER PUBLICATIONS

Ohtoshi, T., et al., "Dependence of optical gain on crystal orientation in surface-emitting lasers with strained quantum wells", *Appl. Phys. Lett.* 65(15), pp. 1886-1887, Oct. 10, 1994. Jan. 11, 2001 European search report in connection with counterpart European patent application No. 09 25 1536.
Nhan, Elbert, et al. (2006), "Interpretation of polarization pinning due to scattering loss differentation in asymmetric vertical-cavity surface-emitting laser cavities," Journal of Applied Physics, vol. 99, No. 12, pp. 123101-1 to 123101-17.

* cited by examiner

*Primary Examiner* — Minsun Harvey
*Assistant Examiner* — Patrick Stafford
(74) *Attorney, Agent, or Firm* — Cooper & Dunham LLP

(57) ABSTRACT

In a surface emitting laser element, on an inclined substrate, a resonator structural body including an active layer, and a lower semiconductor DBR and an upper semiconductor DBR sandwiching the resonator structural body are stacked. A shape of a current passing-through region in an oxide confinement structure of the upper semiconductor DBR is symmetrical to an axis passing through a center of the current passing-through region parallel to an X axis and symmetrical to an axis passing through the center of the current passing-through region parallel to a Y axis, and a thickness of an oxidized layer surrounding the current passing-through region is greater in the +Y direction than in the +X and −X directions. An opening width of a light outputting section in the X axis direction is smaller than another opening width of the light outputting section in the Y axis direction.

17 Claims, 17 Drawing Sheets

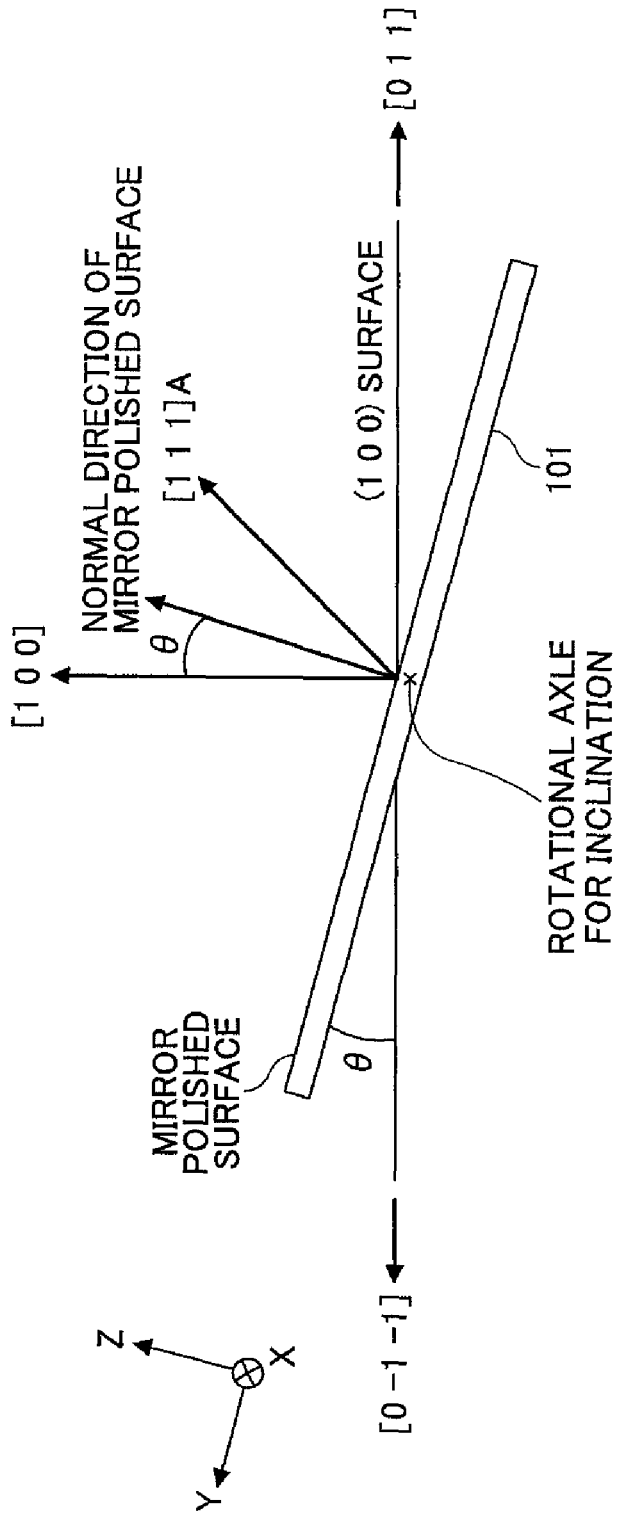

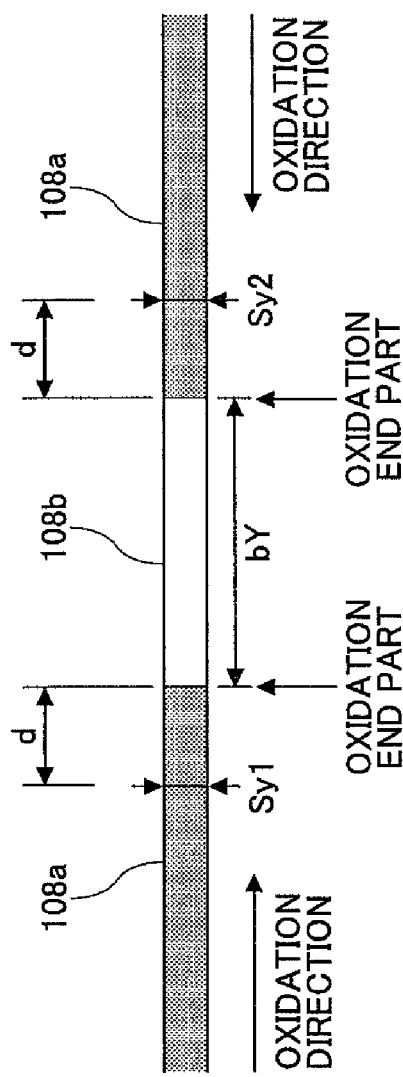
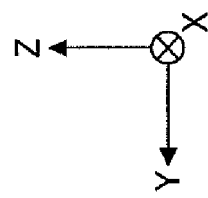
FIG.7
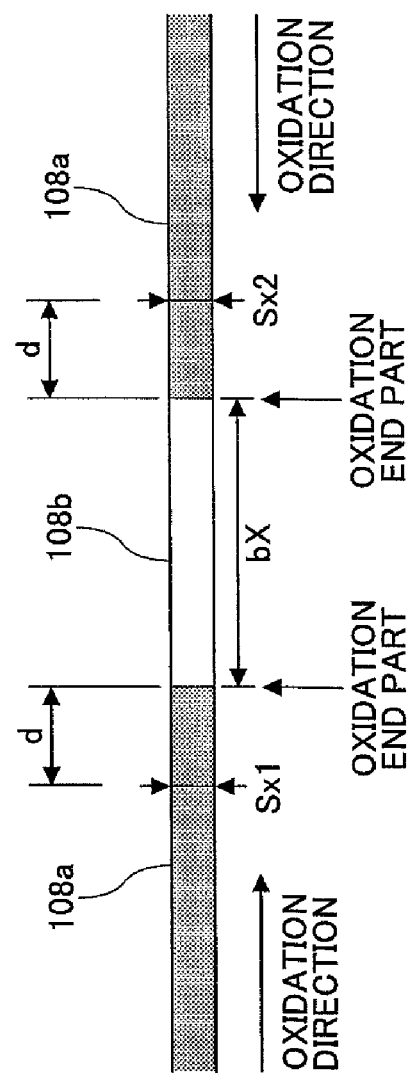
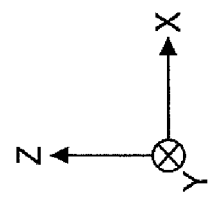
FIG.8

LASER BEAM
CURRENT PASSING-THROUGH REGION
OUTER SHAPE OF MESA

LASER BEAM
LIGHT OUTPUTTING SECTION
OUTER SHAPE OF MESA

Prior Art

SURFACE EMITTING LASER ELEMENT, SURFACE EMITTING LASER ARRAY, OPTICAL SCANNING DEVICE, AND IMAGE FORMING APPARATUS

BACKGROUND

1. Technical Field

This disclosure generally relates to a surface emitting laser element which emits laser beams in a direction perpendicular to a surface of a substrate of the surface emitting laser element, a surface emitting laser array in which the surface emitting laser elements are arrayed, an optical scanning device using the surface emitting laser element or the surface emitting laser array, and an image forming apparatus using the optical scanning device.

2. Description of the Related Art

A VCSEL (vertical cavity surface emitting laser) emits laser beams in a direction perpendicular to a surface of a substrate of the VCSEL and has low cost, low current consumption, a small size, and high efficiency, and is suitable for a two-dimensional device, when the VCSEL is compared with an edge emitting laser. Therefore, the VCSEL has been greatly researched.

As application fields of the VCSEL, there are a light source of an optical writing system of a printer (oscillation wavelength is in a 780 nm band), a recording and reproducing light source of an optical disk device (oscillation wavelength is in a 780 nm band and a 850 nm band), and a light source of an optical transmission system using an optical fiber, for example, a LAN (local area network) (oscillation wavelength is in a 1.3 µm band and a 1.5 µm band). In addition, the VCSEL has been expected to be used as a light source between boards, inside the board, between chips in an LSI (large scale integration), and inside the chips of the LSI.

In the application fields of the VCSEL, in many cases, a laser beam output from the VCSEL (hereinafter in some cases referred to as an output laser beam) is required to have a constant polarization mode and a circular cross sectional shape.

With respect to control of the polarization mode, in manufacturing of a VCSEL using a substrate (non-inclined substrate) whose principal surface is a (100) surface, a current passing-through region (current channel region) has an anisotropic shape (for example, see Patent Documents 1 through 3).

In addition, the polarization mode is controlled by using a so-called inclined substrate (see Patent Document 4 and Non-Patent Document 1).

Further, with respect to the cross sectional shape of the output laser beam, the shape of the current passing-through region is determined to be a circle or a square by adjusting a column shape (mesa shape) of a resonator structural body (see Patent Document 5).

However, when the current passing-through region has the anisotropic shape, it is difficult for the cross sectional shape of the output laser beam to be a circle. In addition, when an inclined substrate is simply used, the shape of the current passing-through region becomes asymmetrical (see FIG. 17A), and it is difficult for the cross sectional shape of the output laser beam to be a circle. In FIG. 17B, a current passing-through region whose shape is symmetrical for two axes is shown.

[Patent Document 1] Japanese Unexamined Patent Publication No. H9-172218
[Patent Document 2] Japanese Patent No. 2891133
[Patent Document 3] Japanese Unexamined Patent Publication No. 2008-28424
[Patent Document 4] Japanese Patent No. 4010095
[Patent Document 5] Japanese Patent No. 3762765
[Non-Patent Document 1] T. Ohtoshi, T. Kuroda, A. Niwa, and S. Tsuji "Dependence of optical gain on crystal orientation in surface emitting lasers with strained quantum wells", Appl. Phys. Lett. 65(15), pp. 1886-1877, 1994

The inventors of the present invention have studied a relationship between a shape of a current passing-through region, and a polarization suppression ratio and a radiation angle of an output laser beam in detail by manufacturing a surface emitting laser element having an inclined substrate. As a result, the inventors have newly found the following. That is, in some cases, it is difficult for a cross sectional shape of an output laser beam to be a circle, by only causing the shape of the current passing-through region to be a circle or a square.

The inventors have studied the reasons of the above results in detail and have newly found that the thickness of an oxide surrounding the current passing-through region greatly influences the radiation angle of the output laser beam when an inclined substrate is used.

BRIEF SUMMARY

In an aspect of this disclosure, there is provided a surface emitting laser element which emits laser beams in a direction perpendicular to a surface of a substrate of the surface emitting laser element, a surface emitting laser array in which the surface emitting laser elements are arrayed, an optical scanning device using the surface emitting laser element or the surface emitting laser array, and an image forming apparatus using the optical scanning device, in which stability in a polarization direction of the output laser beams can be obtained without causing high cost and a cross sectional shape of output laser beams can be substantially a circle.

In another aspect, there is provided a surface emitting laser element which includes a substrate whose normal direction of a principal surface is inclined to one direction of a [1 1 1] crystal orientation relative to one direction of a [1 0 0] crystal orientation, a resonator structural body including an active layer, first and second semiconductor distributed Bragg reflectors which sandwich the resonator structural , body and include a confinement structure in which a current passing-through region is surrounded by an oxidized layer, a plurality of semiconductor layers stacked on the substrate, and a metal layer having an opening part which becomes a light outputting section on the plural semiconductor layers. A laser beam whose cross sectional shape has a long length direction is input to the metal layer via the oxide confinement structure, and an opening width of the light outputting section in a first direction orthogonal to the long length direction of the laser beam is smaller than another opening width of the light outputting section in a second direction parallel to the long length direction of the laser beam.

BRIEF DESCRIPTION OF THE DRAWINGS

Features The aforementioned and other aspects, features and advantages will become more apparent from the following detailed description when read in conjunction with the accompanying drawings, in which:

FIG. 4A is a diagram showing an inclination of a substrate shown in FIG. 3A;

FIG. 7 is a cut-away side view of an oxide confinement structure shown in FIG. 6 along line A-A of FIG. 6;

FIG. 8 is a cut-away side view of the oxide confinement structure shown in FIG. 6 along line B-B of FIG. 6;

DESCRIPTION OF THE PREFERRED EMBODIMENT

[Best Mode of Carrying Out the Invention]

The best mode of carrying out the present invention is described with reference to the accompanying drawings.

Referring to FIGS. 1 through 11, an embodiment of the present invention is described.

Figure 1:
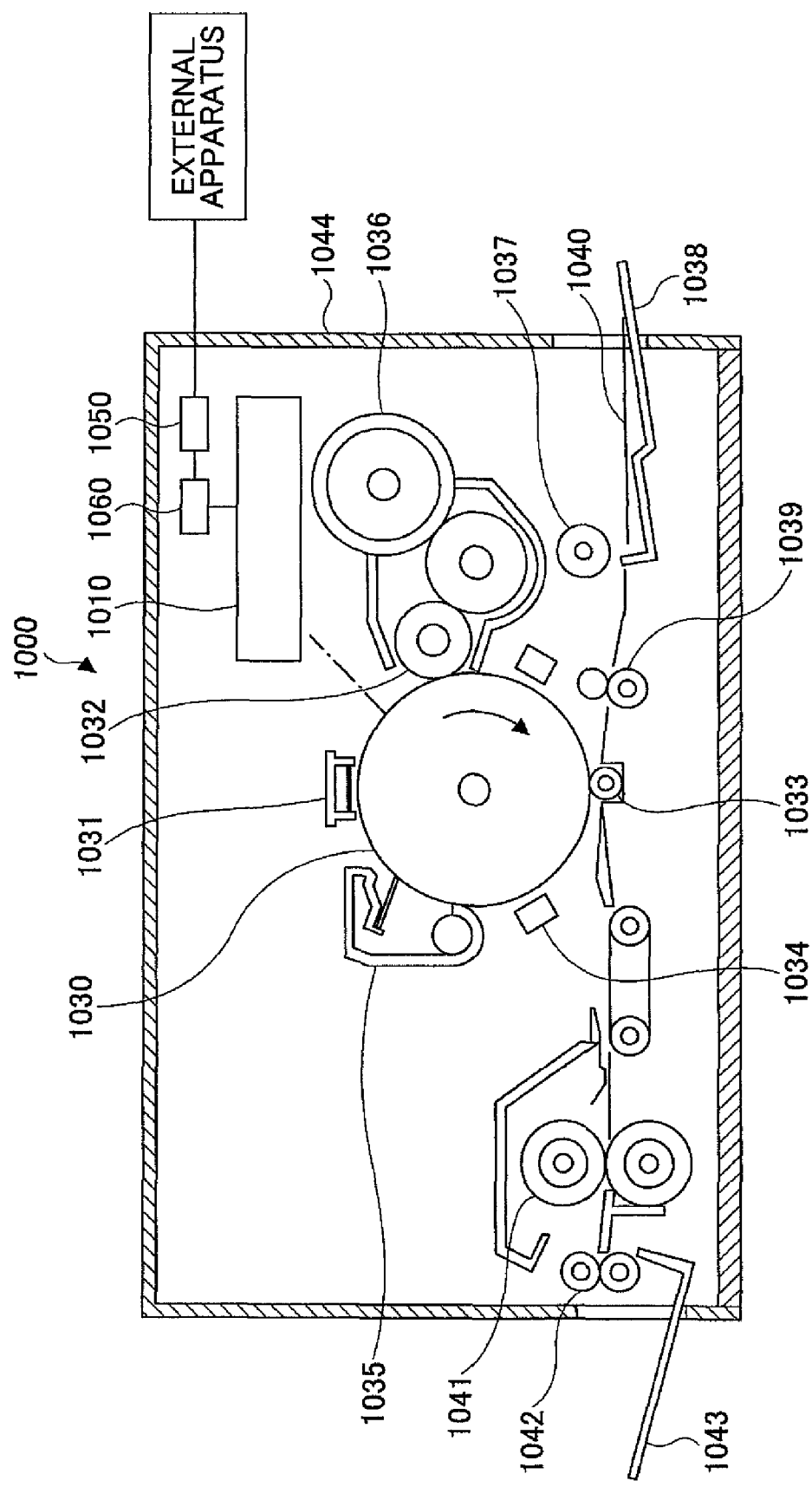
FIG. 1 is a cut-away side view of an image forming apparatus according to an embodiment of the present invention.

FIG. 1 is a cut-away side view of an image forming apparatus according to the embodiment of the present invention. In FIG. 1, as the image forming apparatus, a laser printer 1000 is shown.

As shown in FIG. 1, the laser printer 1000 includes an optical scanning device 1010, a photoconductor drum 1030, a charger 1031, a developing roller 1032, a transfer charger 1033, a discharging unit 1034, a cleaning unit 1035, a toner cartridge 1036, a paper feeding roller 1037, a paper feeding tray 1038, a pair of registration rollers 1039, fixing rollers 1041, paper outputting rollers 1042, a paper outputting tray 1043, a communication controller 1050, and a printer controller 1060 for totally controlling the above elements at corresponding predetermined positions in a printer cabinet 1044.

The communication controller 1050 controls interactive communications with an external apparatus (for example, a personal computer) via, for example, a network.

The photoconductor drum 1030 (image carrier) is a cylinder-shaped member and a photoconductor layer is formed on the surface of the photoconductor drum 1030. That is, the surface of the photoconductor drum 1030 is a surface to be scanned. The photoconductor drum 1030 is rotated in the arrow direction shown in FIG. 1.

The charger 1031, the developing roller 1032, the transfer charger 1033, the discharging unit 1034, and the cleaning unit 1035 are disposed near the surface of the photoconductor drum 1030. The charger 1031, the developing roller 1032, the transfer charger 1033, the discharging unit 1034, and the cleaning unit 1035 are sequentially disposed along the rotation direction of the photoconductor drum 1030 in this order.

The charger 1031 uniformly charges the surface of the photoconductor drum 1030.

The optical scanning device 1010 radiates a light flux (laser beam) modulated based on image information transmitted from the external apparatus onto the surface of the photoconductor drum 1030 charged by the charger 1031. With this, an electrostatic latent image based on the image information is formed onto the surface of the photoconductor drum 1030. The formed electrostatic latent image is moved to the developing roller 1032 corresponding to the rotation of the photoconductor drum 1030. The optical scanning device 1010 is described below in detail.

Toners are stored in the toner cartridge 1036 and the stored toners are supplied to the developing roller 1032.

The developing roller 1032 adheres the toners supplied from the toner cartridge 1036 onto the electrostatic latent image formed on the surface of the photoconductor drum 1030. With this, the electrostatic latent image is developed and the image information is caused to appear. The electrostatic latent image on which the toners are adhered (toner image) is moved to the transfer charger 1033 corresponding to the rotation of the photoconductor drum 1030.

Recording paper 1040 is stored in the paper feeding tray 1038. The paper feeding roller 1037, which is disposed near the paper feeding tray 1038, picks up the recording paper 1040 one by one from the paper feeding tray 1038, and transports the picked up recording paper 1040 to the pair of the registration rollers 1039. The pair of the registration rollers 1039 temporarily holds the recording paper 1040 picked up by the paper feeding roller 1037 and transports the recording paper 1040 to a position (gap) between the photoconductor drum 1030 and the transfer charger 1033 corresponding to the rotation of the photoconductor drum 1030.

A voltage whose polarity is reverse to the polarity of the toners is applied onto the transfer charger 1033 so that the toner image on the photoconductor drum 1030 is electrically attracted onto the recording paper 1040. The toner image on the surface of the photoconductor drum 1030 is transferred onto the recording paper 1040 by the voltage. The recording paper 1040 onto which the toner image has been transferred is transported to the fixing rollers 1041.

Heat and pressure are applied to the recording paper 1040 by the fixing rollers 1041. With this, the toner image on the recording paper 1040 is fixed. The recording paper 1040 on which the toner image has been fixed by the fixing rollers 1041 is transported to the paper outputting tray 1043 via the paper outputting rollers 1042, and the recording paper 1040 is stacked on the paper outputting tray 1043.

The discharging unit 1034 discharges the surface of the photoconductor drum 1030.

The cleaning unit 1035 removes the toners remaining on the surface of the photoconductor drum 1030. The surface of the photoconductor drum 1030 on which the remaining toners have been removed returns to a position to face the charger 1031.

Figure 2:
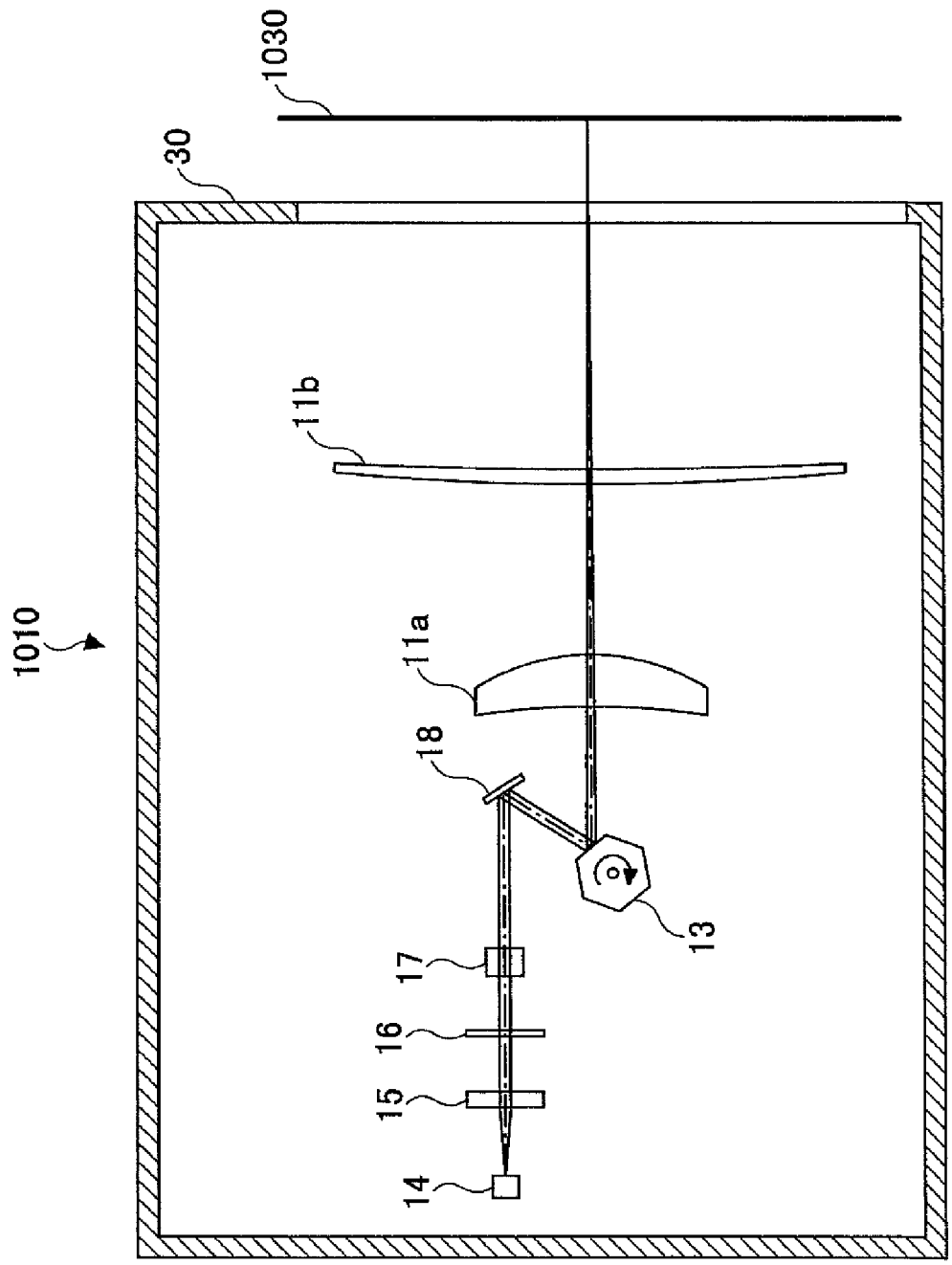
FIG. 2 is a cut-away side view of an optical scanning device shown in FIG. 1.

Next, a structure of the optical scanning device 1010 is described. FIG. 2 is a cut-away side view of the optical scanning device 1010.

As shown in FIG. 2, as an example, the optical scanning device 1010 includes a deflector side scanning lens 11*a*, an image face side scanning lens 11*b*, a polygon mirror 13 (deflecting unit), a light source 14, a coupling lens 15, an aperture plate 16, an anamorphic lens 17, a reflection mirror 18, and a scanning controller (not shown) at corresponding predetermined positions in housing 30.

In the following, the direction corresponding to the main scanning direction is called the main scanning corresponding direction and the direction corresponding to the sub scanning direction is called the sub scanning corresponding direction.

The coupling lens 15 causes the light flux (laser beam) output from the light source 14 to be approximately parallel light. The light source 14 and the coupling lens 15 are secured to a supporting member formed of aluminum and are integrated together.

The aperture plate 16 includes an aperture section and controls the beam diameter of the light flux sent from the coupling lens 15.

The anamorphic lens 17 forms an image near the deflection reflection surface of the polygon mirror 13 from the light flux passed through the aperture section of the aperture plate 16 via the reflection mirror 18 in the sub scanning corresponding direction.

An optical system disposed on an optical route between the light source 14 and the polygon mirror 13 is called an optical system before deflector. In the present embodiment, the optical system before deflector is formed of the coupling lens 15, the aperture plate 16, the anamorphic lens 17, and the reflection mirror 18.

The polygon mirror 13 has a six-sided mirror whose inscribing circle radius is, for example, 18 mm and each mirror is a deflection reflection surface. The polygon mirror 13 rotates at a constant speed around an axle parallel to the sub scanning corresponding direction and deflects the light flux from the reflection mirror 18.

The deflector side scanning lens 11*a* is in the optical route of the light flux deflected by the polygon mirror 13.

The image face side scanning lens 11*b* is in the optical route from the deflector side scanning lens 11*a*. The light flux from the image face side scanning lens 11*b* is radiated onto the surface of the photoconductor drum 1030, and a light spot is formed on the surface of the photoconductor drum 1030. The light spot moves in the long length direction (the width direction) of the photoconductor drum 1030 corresponding to the rotation of the polygon mirror 13. That is, the light spot scans the surface of the photoconductor drum 1030. The moving direction of the light spot is the main scanning direction, and the rotation direction of the photoconductor drum 1030 is the sub scanning direction.

An optical system on an optical route between the polygon mirror 13 and the photoconductor drum 1030 is called a scanning optical system. In the present embodiment, the scanning optical system is formed of the deflector side scanning lens 11*a* and the image face side scanning lens 11*b*. In addition, at least one optical axis folding mirror can be disposed on at least one of the optical route between the deflector side scanning lens 11*a* and the image face side scanning lens 11*b*, and the optical route between the image face side scanning lens 11*b* and the photoconductor drum 1030.

Figure 3A:
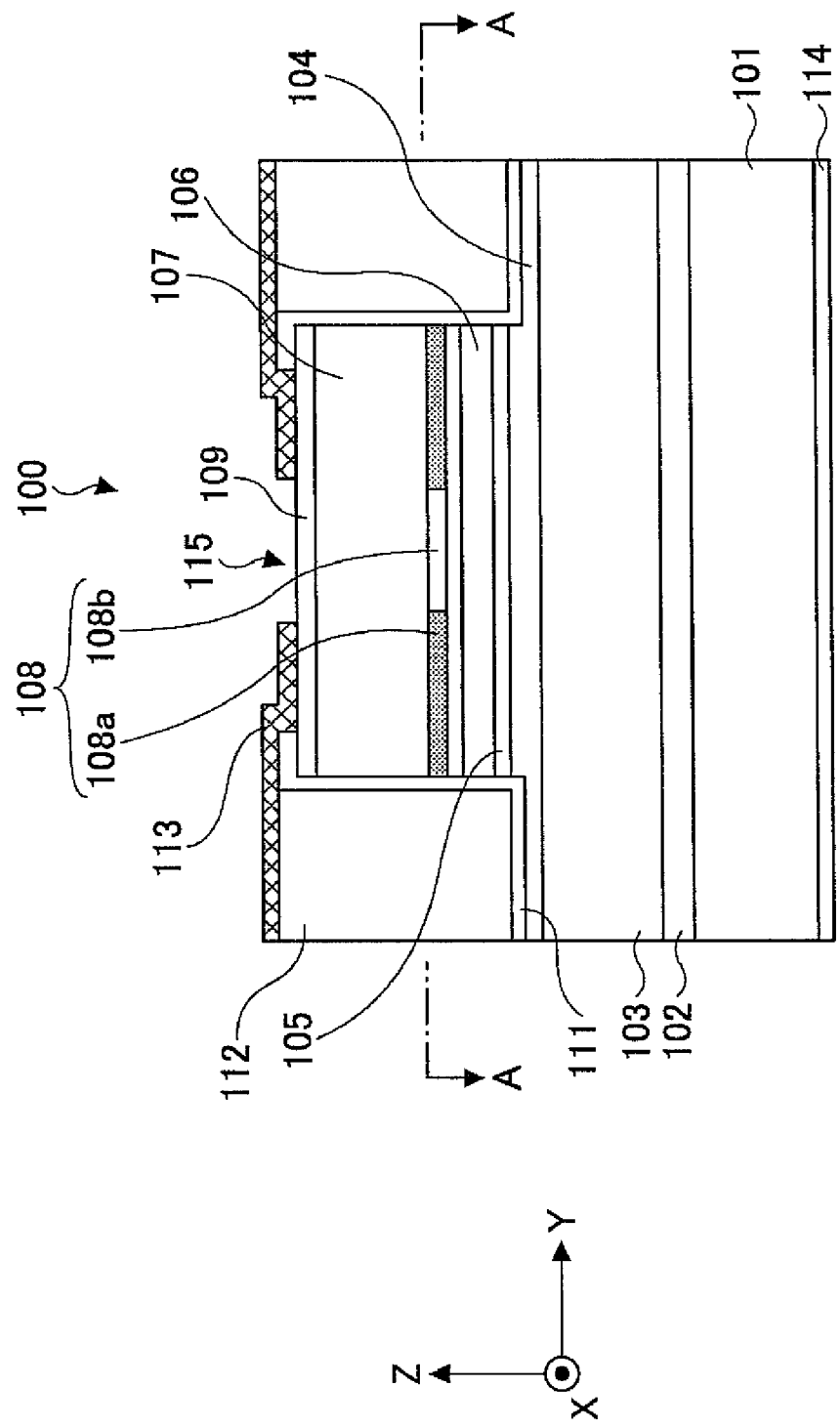
FIG. 3A is a cut-away side view of a surface emitting laser element according to the embodiment of the present invention.
Figure 3B:
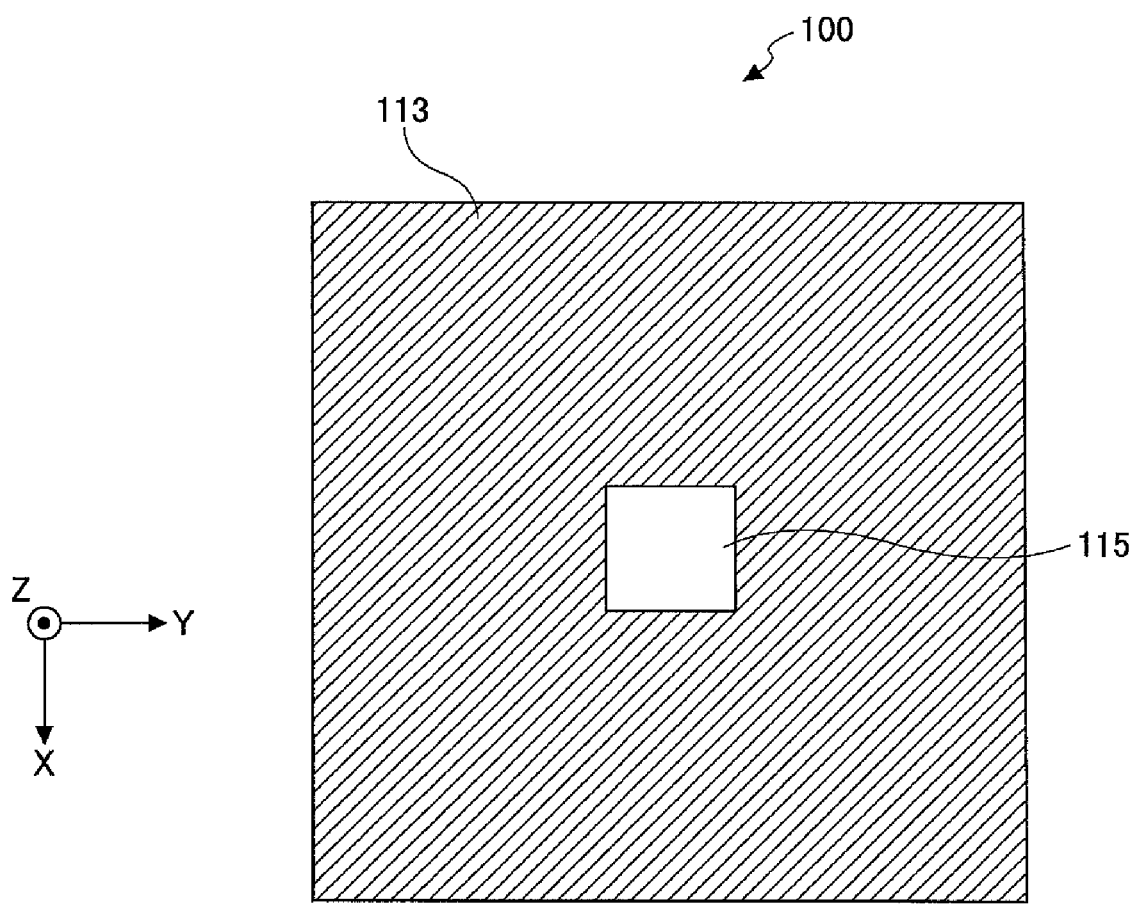
FIG. 3B is a top view of the surface emitting laser element shown in FIG. 3A.

FIG. 3A is a cut-away side view of a surface emitting laser element 100 according to the embodiment of the present invention. FIG. 3B is a top view of the surface emitting laser element 100. As an example, the light source 14 includes the surface emitting laser element 100 shown in FIGS. 3A and 3B.

In the description of the present invention, the laser beam (light flux) radiating direction is a Z axis direction, and two directions orthogonal to each other on a surface perpendicular to the Z axis direction are an X axis direction and a Y axis direction, respectively.

A designed oscillation wavelength of the surface emitting laser element 100 is in a 780 nm band. The surface emitting laser element 100 includes a substrate 101, a buffer layer 102, a lower semiconductor DBR (distributed Bragg reflector) 103, a lower spacer layer 104, an active layer 105, an upper spacer layer 106, an upper semiconductor DBR 107, a contact layer 109, and so on.

In FIGS. 3A and 3B, elements having corresponding reference numbers 108, 108*a*, 108*b*, 112, 113, 114, and 115 are described below.

Figure 4B:
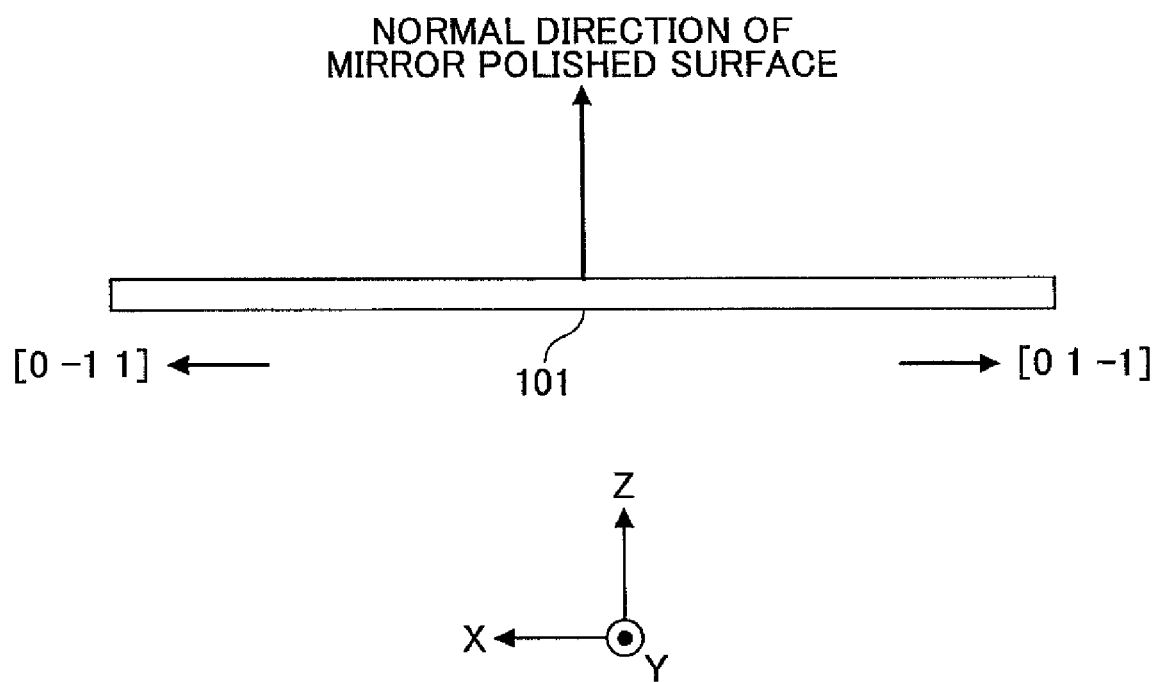
FIG. 4B is a diagram showing a position of the substrate shown in FIG. 3A.

FIG. 4A is a diagram showing an inclination of the substrate 101. FIG. 4B is a diagram showing a position of the substrate 101.

The surface of the substrate 101 is a mirror polished surface, and the substrate 101 is an n-GaAs single crystal substrate. As shown in FIG. 4A, the normal direction of the mirror polished surface (principal surface) of the substrate 101 is inclined by 15 degrees (θ=15 degrees) to the [1 1 1] A crystal orientation direction relative to the [1 0 0] crystal orientation direction. That is, the substrate 101 is a so-called inclined substrate. As shown in FIG. 4B, the substrate 101 is disposed so that the [0 1 −1] crystal orientation direction is the −X direction, and the [0 −1 1] crystal orientation direction is the +X direction.

Returning to FIG. 3A, the buffer layer 102 is stacked on a +Z side surface of the substrate 101 and is formed of n-GaAs.

The lower semiconductor DBR 103 is stacked at the +Z side of the buffer layer 102 and includes 40.5 pairs of a low refractive index layer formed of n-AlAs and a high refractive index layer formed of n-$Al_{0.3}Ga_{0.7}As$.

In addition, in order to decrease an electric resistance value, a composition gradient layer of 20 nm thickness is formed between the refractive index layers in which the composition is gradually changed from one composition to the other composition. Each of the refractive index layers is determined to have an optical thickness of λ/4 by including ½ of the adjacent composition gradient layers when the oscillation wavelength is λ.

The following relationship exists between the optical thickness and the actual thickness. When the optical thickness is λ/4, the actual thickness "h"=λ/4N (N is the refractive index of a medium of the layer).

The lower spacer layer 104 is stacked at the +Z side of the lower semiconductor DBR 103 and is formed of non-doped $(Al_{0.1}Ga_{0.9})_{0.5}In_{0.5}P$.

The active layer 105 is stacked at the +Z side of the lower spacer layer 104 and has a triple quantum well structure having quantum well layers of three layers and barrier layers of four layers. Each of the quantum well layers is formed of GaInAsP whose composition induces a compression strain of 0.7%, and has a band gap wavelength of approximately 780 nm. Each of the barrier layers is formed of GaInP whose composition induces a tensile strain of 0.6%.

The upper spacer layer 106 is stacked at the +Z side of the active layer 105 and is formed of non-doped $(Al_{0.1}Ga_{0.9})_{0.5}In_{0.5}P$.

A part formed of the lower spacer layer 104, the active layer 105, and the upper spacer layer 106 is called a resonator structural body, and the thickness of the resonator structural body is determined to be the optical thickness of one wavelength. In order to obtain high stimulated emission probability, the active layer 105 is at a center of the resonator structural body which center corresponds to an anti-node position of a standing wave distribution of an electric field.

The upper semiconductor DBR 107 includes a first upper semiconductor DBR (not shown) and a second upper semiconductor DBR (not shown).

The first upper semiconductor DBR is stacked at the +Z side of the upper spacer layer 106 and includes a pair of a low refractive index layer formed of $p-(Al_{0.7}Ga_{0.3})_{0.5}In_{0.5}P$ and a high refractive index layer formed of $p-(Al_{0.1}Ga_{0.9})_{0.5}In_{0.5}P$.

The second upper semiconductor DBR is stacked at the +Z side of the first upper semiconductor DBR and includes 23 pairs of a low refractive index layer formed of $p-Al_{0.9}Ga_{0.1}As$ and a high refractive index layer formed of $p-Al_{0.3}Ga_{0.7}As$.

In order to decrease an electric resistance value, a composition gradient layer is formed between the refractive index layers of the upper semiconductor DBR 107 in which the composition is gradually changed from one composition to the other composition. Each of the low and high refractive index layers is determined to have an optical thickness of $\lambda/4$ by including ½ of the adjacent composition gradient layers when the oscillation wavelength is $\lambda$.

A layer to be selectively oxidized 108 of 30 nm thickness formed of p-AlAs is inserted into one of the low refractive index layers of the second upper semiconductor DBR. The inserting position of the layer to be selectively oxidized 108 is in a $3^{rd}$ pair of the low refractive index layers from the upper spacer layer 106 and at a position corresponding to a node of a standing wave distribution of an electric field.

The contact layer 109 is stacked at the +Z side of the second upper semiconductor DBR and is formed of p-GaAs.

In the following, in some cases, a structure in which plural semiconductor layers are stacked on the substrate 101 is called a layer stacked body.

Next, a manufacturing method of the surface emitting laser element 100 is simply described.

(1): A layer stacked body is formed by crystal growth with the use of an MOCVD (metal organic chemical vapor deposition) method, or an MBE (molecular beam epitaxy) method.

In the above, as a group III raw material, TMA (trimethyl aluminum), TMG (trimethyl gallium), or TMI (trimethyl indium) is used, and as a group V raw material, phosphine ($PH_3$) or arsine ($AsH_3$) is used. In addition, as a raw material of p-type dopant, carbon tetrabromide ($CBr_4$) or dimethylzinc (DMZn) is used, and as a raw material of n-type dopant, hydrogen selenide ($H_2Se$) is used.

(2): A resist pattern having a rectangular shape whose length "aX" in the X axis direction is 25.5 μm and whose length "aY" in the Y axis direction is 25.0 μm is formed on a surface of the layer stacked body (see FIG. 5).

Figure 5:
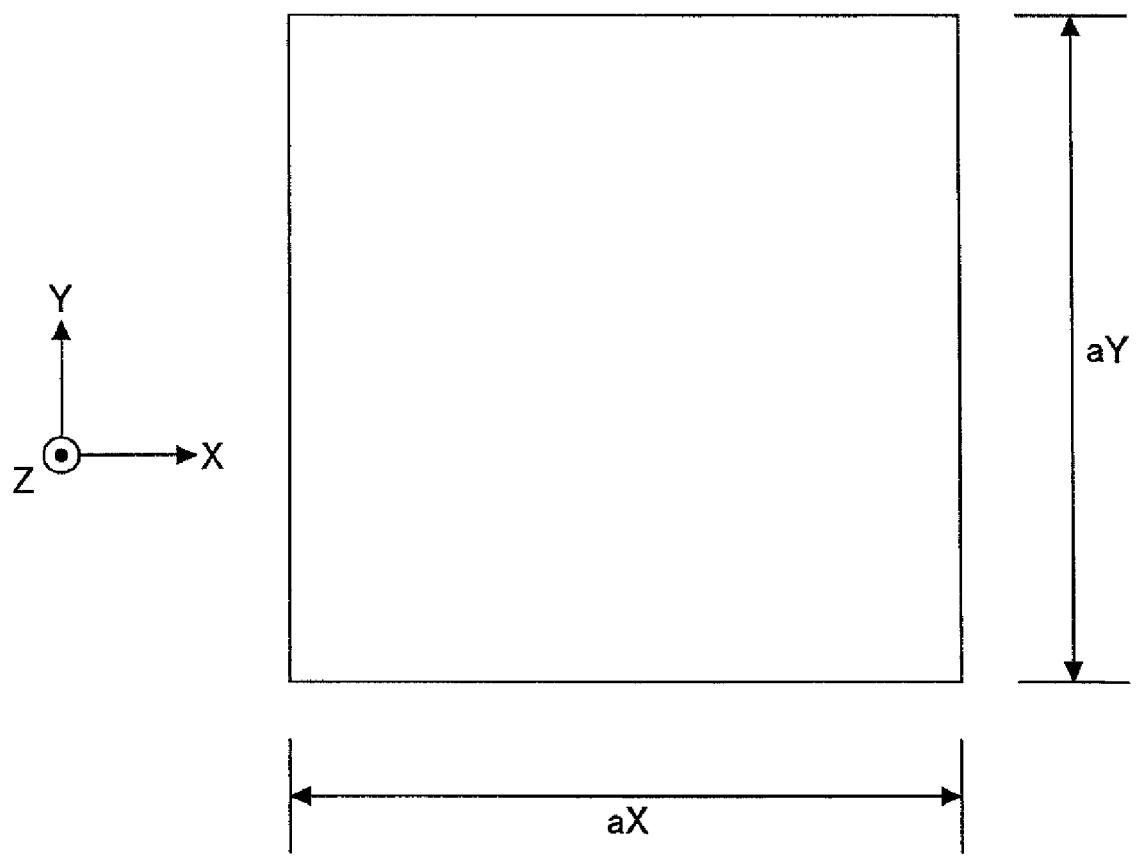
FIG. 5 is a diagram showing an outer shape of a mesa of the surface emitting laser element shown in FIG. 3A.

FIG. 5 is a diagram showing an outer shape of a mesa of the surface emitting laser element 100.

(3): A mesa having a quadrangular prism shape is formed by using an ECR (electron cyclotron resonance) etching method with the use of a $Cl_2$ gas while using the above resist pattern as a photo-mask. The bottom surface of the etching is positioned in the lower spacer layer 104.

(4): The photo-mask is removed.

(5): Heat treatment is applied to the layer stacked body in water vapor. With this, aluminum (Al) in the layer to be selectively oxidized 108 is selectively oxidized from an outer part of the mesa, and a non-oxidized region 108b surrounded by an oxidized layer 108a of Al remains at the center part of the mesa (see FIG. 3A). That is, a so-called oxide confinement structure is formed in which a driving current route of a light emitting part of the surface emitting laser element 100 is confined to the center part of the mesa. The non-oxidized region 108b is a current passing-through region (current injection region).

(6): A protection layer 111 of SiN or $SiO_2$ is formed by using a CVD (chemical vapor deposition) method.

(7): The layer stacked body is flattened by a polyimide layer 112.

(8): A window for a p-electrode contact is opened at the upper part of the mesa. A mask of photoresist is formed, an opening part of the photoresist is removed by exposing the opening part at the upper part of the mesa, and the window is opened by etching the polyimide layer 112 and the protection layer 111 with the use of BHF (buffered hydrofluoric acid).

(9): A resist pattern of a rectangular shape whose length in the X axis direction is 10 μm, and whose length in the Y axis direction is 11.5 μm is formed at a region which becomes a light outputting section (an opening part of a metal layer) at the upper part of the mesa, and a p-electrode material is deposited. As the p-electrode material, a multilayered film formed of Cr/AuZn/Au or Ti/Pt/Au is used.

(10): A p-electrode 113 is formed by lifting off the electrode material at a light outputting section. A part surrounded by the p-electrode 113 is a light outputting section 115. The p-electrode 113 is a metal layer.

(11): The bottom surface of the substrate 101 is polished so that the thickness of the substrate 101 becomes, for example, 100 μm, and an n-electrode 114 is formed on the bottom surface of the substrate 101. The n-electrode 114 is formed of a multilayered film of AuGe/Ni/Au.

(12): Ohmic contact between the p-electrode 113 and the n-electrode 114 is obtained by annealing. With this the mesa becomes the light emitting section.

(13): The surface emitting laser element 100 is formed as a chip by being cut off.

In the surface emitting laser element 100 manufactured by the above method, the polarization direction of the output laser beam is the X axis direction which is a desirable direction, and the polarization suppression ratio is 20 dB or more and stable. The polarization suppression ratio is a ratio of light intensity in the desirable polarization direction to light intensity in the direction orthogonal to the desirable polarization direction, and it is said that an image forming apparatus such as a copying apparatus is required to have approximately 20 dB. In addition, in the surface emitting laser element 100, a difference between the radiation angles of the output laser beams in the X axis direction and the Y axis direction is 0.1° or less, and the cross sectional shape of the output laser beam is substantially circular.

Figure 6:
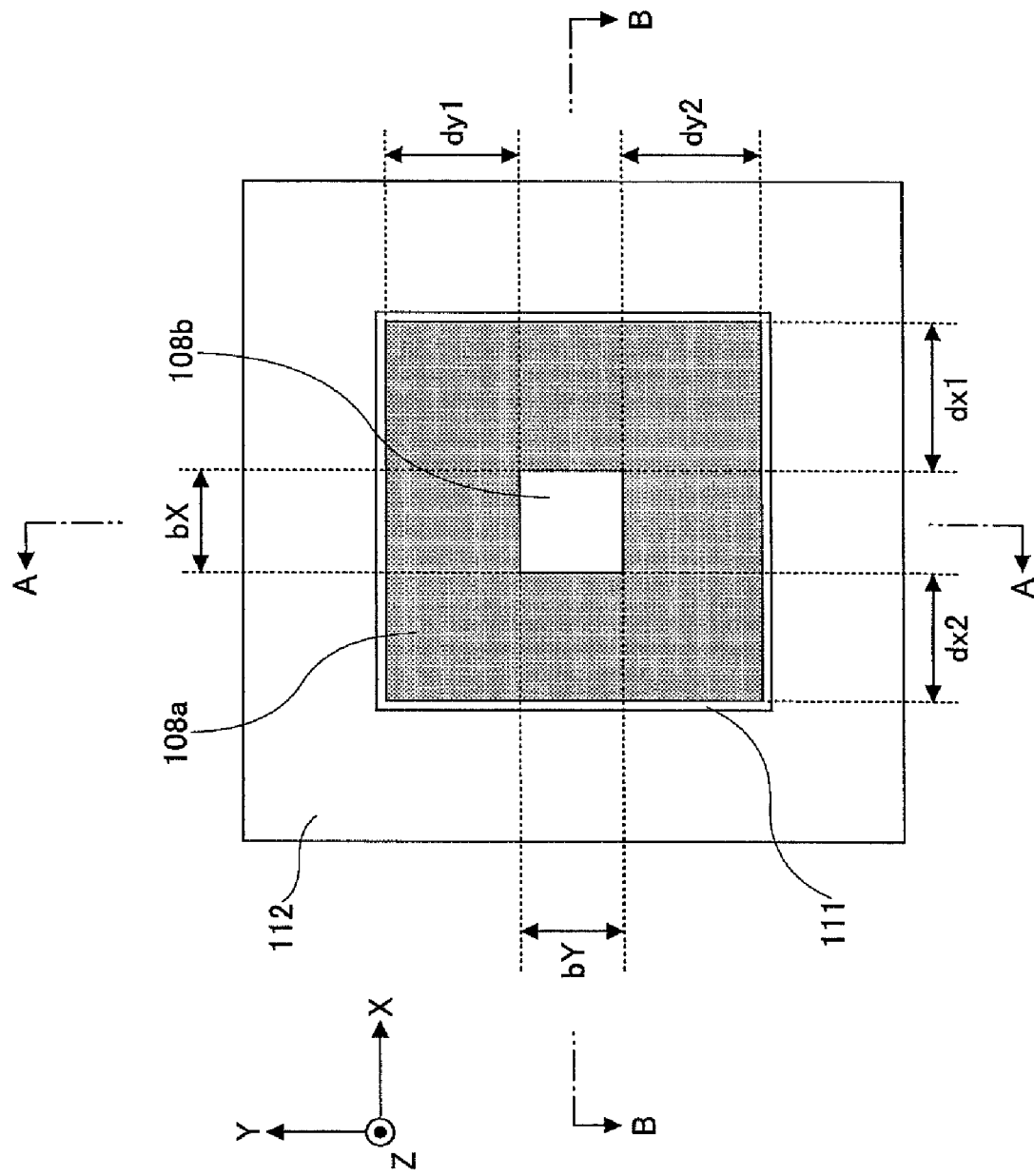
FIG. 6 is a cut-away side view of the surface emitting laser element along line A-A of FIG. 3A.

FIG. 6 is a cut-away side view of the surface emitting laser element 100 along line A-A of FIG. 3A. That is, an oxide confinement structure of the surface emitting laser element 100 is shown in FIG. 6. In FIG. 6, the followings are defined. That is, a distance from the +Y side end of the oxidized layer 108a to the +Y side end of the current passing-through region 108b (the non-oxidized layer) is "dy1", a distance from the −Y side end of the oxidized layer 108a to the −Y side end of the current passing-through region 108b is "dy2", a distance from the +X side end of the oxidized layer 108a to the +X side end of the current passing-through region 108b is "dx1", and a distance from the −X side end of the oxidized layer 108a to the −X side end of the current passing-through region 108b is "dx2". When the distances are measured by using an IR (infrared) microscope, the measured results are dy2>dy1, and dx2≈dx1>dy1. This shows that the oxidization rate in the −Y direction is smaller than the oxidization rates in the +Y, +X, and −X directions.

In addition, in FIG. 6, the followings are defined. That is, a width of the current passing-through region 108b in the Y axis direction is "bY", and a width of the current passing-through region 108b in the X axis direction is "bX". Then the widths are measured and the measured results are "bY"=4.0 μm, "bX"=4.5 μm, and "bY/bX" (the rectangular ratio of the current passing-through region 108b) is 0.89.

FIG. 7 is a cut-away side view of the oxide confinement structure shown in FIG. 6 along line A-A of FIG. 6. In FIG. 7, the followings are defined. That is, the thickness of the oxidized layer 108a at the +Y side of the current passing-through region 108b is "Sy1", and the thickness of the oxidized layer 108a at the −Y side of the current passing-through region 108b is "Sy2". Then when the thicknesses are measured at several positions in the Y axis direction, "Sy1" is greater than "Sy2" by approximately 2 nm even if the distances from the oxidation end parts are the same, for example, at the distances of "d" in FIG. 7.

FIG. 8 is a cut-away side view of the oxide confinement structure shown in FIG. 6 along line B-B of FIG. 6. In FIG. 8, the followings are defined. That is, the thickness of the oxidized layer 108a at the −X side of the current passing-through region 108b is "Sx1", and the thickness of the oxidized layer 108a at the +X side of the current passing-through region 108b is "Sx2". Then when the thicknesses are measured at several positions in the X axis direction, "Sx1" is substantially equal to "Sx2" when the distances from the oxidation end parts are the same, for example, at the distances of "d" in FIG. 8. In addition, the thicknesses of "Sx1" and "Sx2" are smaller than the thickness of "Sy1" even if the distance from the oxidation end part is the same.

The inventors of the present invention have manufactured plural surface emitting laser elements 100 whose rectangular ratios of the current passing-through regions 108b are different from each other, and have obtained a relationship between the rectangular ratio and the polarization suppression ratio.

Figure 9:
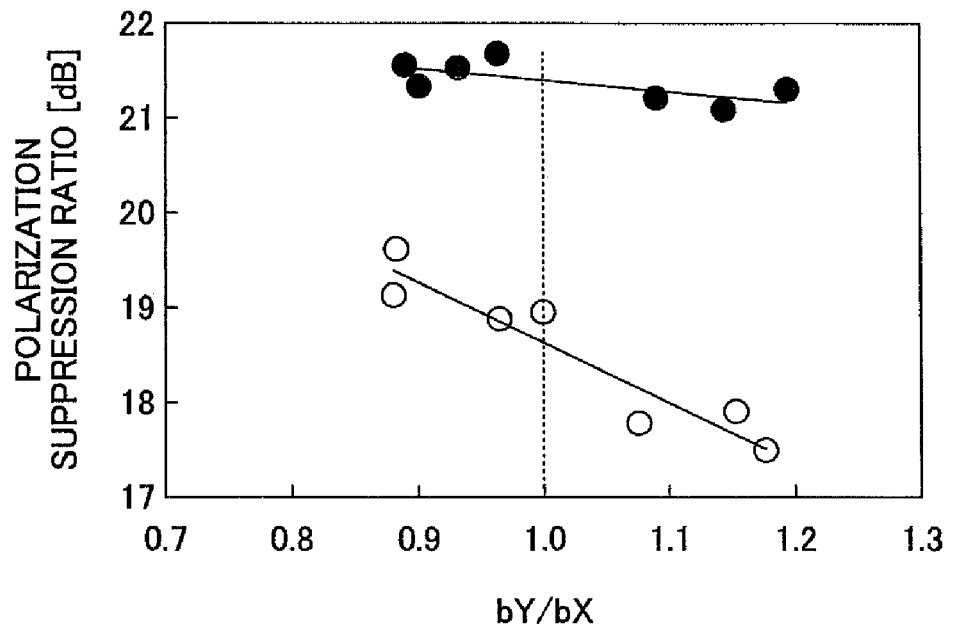
FIG. 9 is a graph showing a relationship between a rectangular ratio of the current passing-through region and a polarization suppression ratio in manufactured surface emitting laser elements.

FIG. 9 is a graph showing the relationship between the rectangular ratio (bY/bX) of the current passing-through region 108b and the polarization suppression ratio in the manufactured surface emitting laser elements 100. In FIG. 9, the polarization directions of the surface emitting laser elements 100 are the X axis direction; that is, the same direction. In FIG. 9, black circles show plural surface emitting laser elements of a first group and white circles show plural surface emitting laser elements of a second group and structures of the first and second groups are partially different from each other. As shown in FIG. 9, in any of the first and second groups, when the rectangular ratio (bY/bX) is less than 1.0; that is, when the length in the X axis direction is greater than the length in the Y axis direction in the current passing-through region 108b, the polarization suppression ratio can be great.

Generally, in a surface emitting laser element, the radiation angle of the output laser beam tends to be great when light confinement in the lateral direction (hereinafter, in some cases, simply referred to as light confinement) is great. The degree of the light confinement becomes great when the width of the current passing-through region is small and the thickness of the oxidized layer is great. That is, when the width of the current passing-through region is small and the thickness of the oxidized layer is great, the radiation angle of the output laser beam tends to become great.

Figure 10:
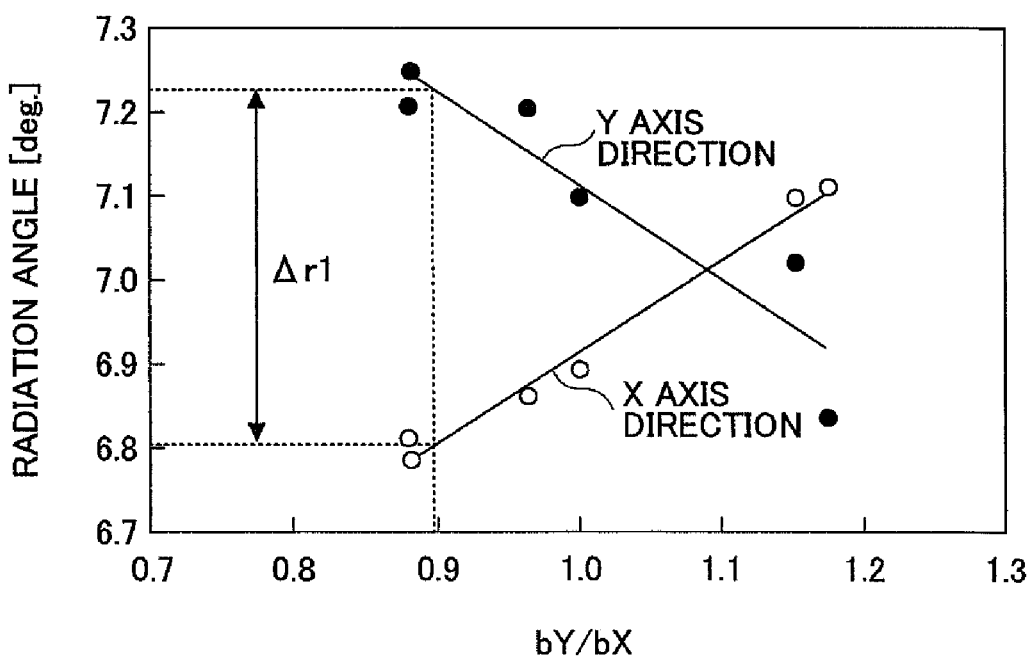
FIG. 10 is a graph showing a relationship between the rectangular ratio of the current passing-through region and the radiation angle of the output laser beam of a surface emitting laser element using an inclined substrate similar to the substrate shown in FIG. 3A.

FIG. 10 is a graph showing a relationship between the rectangular ratio of the current passing-through region and the radiation angle of the output laser beam of a surface emitting laser element using an inclined substrate similar to the substrate 101 in which the shape of the light outputting section is square. As shown in FIG. 10, when the rectangular ratio (bY/bX) of the current passing-through region becomes great, the radiation angle in the X axis direction becomes great, and the radiation angle in the Y axis direction becomes small. In addition, when the rectangular ratio (bY/bX) of the current passing-through region is approximately 1.1, the radiation angles in the X and Y axes direction become the same.

That is, when the rectangular ratio of the current passing-through region is less than approximately 1.1, the cross sectional shape of the output laser beam is ellipsoidal in which the Y axis direction is the long length direction. In addition, when the rectangular ratio of the current passing-through region is more than approximately 1.1, the cross sectional shape of the output laser beam is ellipsoidal in which the X axis direction is the long length direction. When the rectangular ratio of the current passing-through region is 1.0; that is, the shape of the current passing-through region is square, the radiation angles in the X and Y axes directions are different due to the relationship "Sx1≈Sx2<Sy1" of the oxidized layer.

When the rectangular ratio of the current passing-through region is less than approximately 1.1, the smaller the rectangular ratio of the current passing-through region is, the greater the difference between the radiation angles in the X axis direction and the Y axis direction is (hereinafter, in some cases, simply referred to as a radiation angle difference).

As described above, in order to increase the polarization suppression ratio, it is effective that the rectangular ratio of the current passing-through region is made to be small. In particular, when the rectangular ratio of the current passing-through region is made to be less than 1.0, a higher polarization suppression ratio can be obtained than a conventional case is. However, when the rectangular ratio of the current passing-through region is made to be less than 1.0, the radiation angle difference becomes larger than a conventional case is.

For example, when the rectangular ratio of the current passing-through region is 1.0, the radiation angle difference is approximately 0.2°, and when the rectangular ratio of the current passing-through region is 0.89, the radiation angle difference is approximately 0.4° (see Δr1 in FIG. 10).

Figure 11:
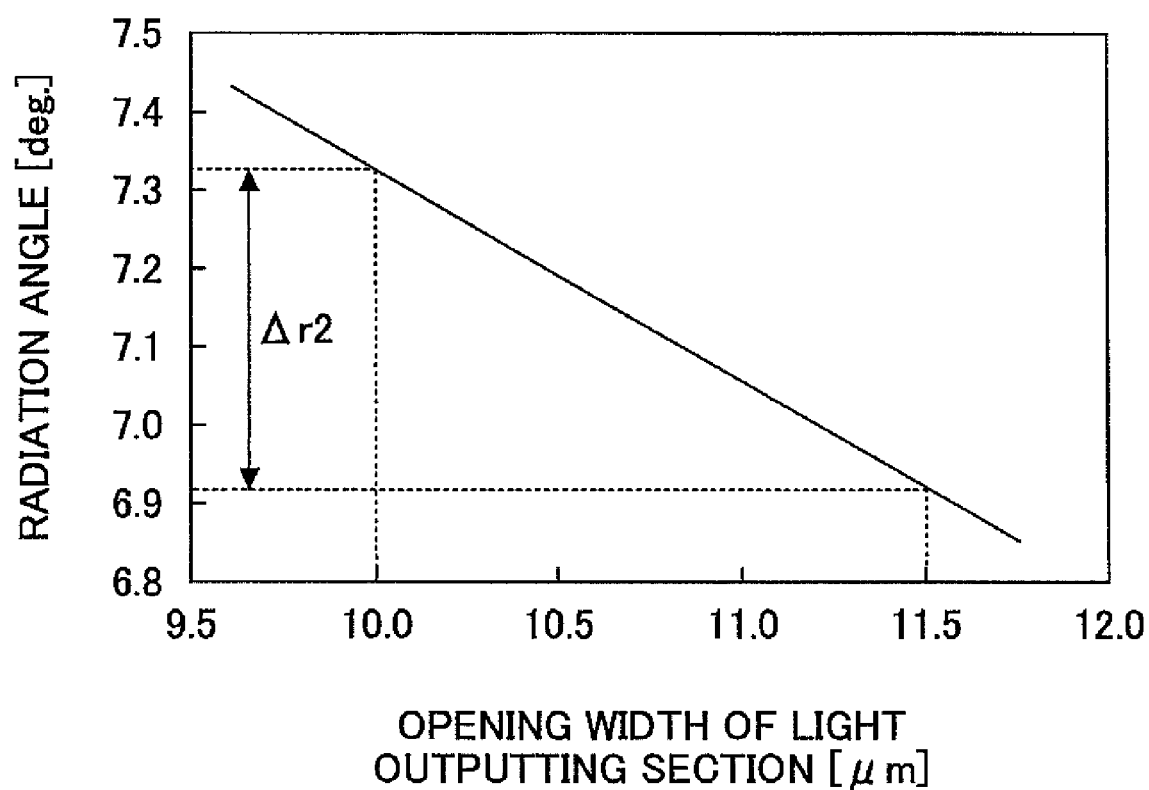
FIG. 11 is a graph showing a relationship between an opening width of the light outputting section and an radiation angle of an output laser beam in the X axis direction of a surface emitting laser element using an inclined substrate similar to the substrate shown in FIG. 3A.

FIG. 11 is a graph showing a relationship between an opening width of the light outputting section and an radiation angle of an output laser beam in the X axis direction of a surface emitting laser element using an inclined substrate similar to the substrate 101 in which the shapes of the light outputting section and the current passing-through region are square.

As shown in FIG. 11, the radiation angle of the output laser beam depends on the opening width of the light outputting section. When the opening width is small, the radiation angle of the output laser beam tends to become large. This tendency is the same as the radiation angle in the Y axis direction.

By the above, the long length direction of the cross sectional shape of the output laser beam can be determined to be the X axis direction or the Y axis direction, by using a magnitude relation between the opening widths of the light outputting section in the X and Y axes directions. In addition, the size of the radiation angle difference can be adjusted by a difference (absolute value) between the opening widths of the light outputting section in the X axis direction and the Y axis direction.

Therefore, an increase of the radiation angle difference due to the shape of the current passing-through region 108b and non-uniformity of the thickness of the oxidized layer 108a in the oxide confinement structure can be compensated by the shape of the light outputting section 115.

In the present embodiment, in the light outputting section 115, the opening widths in the X and Y axes directions are determined so that the opening width in the X axis direction is smaller than the opening width in the Y axis direction, "the radiation angle in the X axis direction>the radiation angle in the Y axis direction", and the size of the radiation angle difference is to be a value ($\Delta r2$ in FIG. 11) approximated to the value $\Delta r1$. Specifically, the opening width in the X axis direction is determined to be 10.0 µm, and the opening width in the Y axis direction is determined to be 11.5 µm.

With this, even if the shape of the current passing-through region 108b is not square and the thickness of the oxidized layer 108a surrounding the current passing-through region 108b in not uniform, the cross sectional shape of the output laser beam can be substantially circular.

As described above, according to the surface emitting laser element 100 in the present embodiment, on the substrate 101 in which the normal direction of the principal surface (the mirror polished surface) is inclined by 15 degrees in the [1 1 1] A crystal orientation direction relative to the [1 0 0] crystal orientation direction, the resonator structural body including the active layer 105 and the plural semiconductor layers including the lower semiconductor DBR 103 and the upper semiconductor DBR 107 sandwiching the resonator structural body are stacked.

In addition, in the oxide confinement structure in the upper semiconductor DBR 107, the rectangular ratio of the current passing-through region 108b is 0.89, and in the oxidized layer 108a surrounding the current passing-through region 108b, the oxidized thickness in the +Y direction is greater than in the +X, and –X directions.

In addition, the shape of the current passing-through region 108b is symmetrical for an axis (first axis) which passes through the center of the current passing-through region 108b and is parallel to the X axis and is symmetrical for another axis (second axis) which passes through the center of the current passing-through region 108b and is parallel to the Y axis.

In addition, in the light outputting section 115, the opening width in the X axis direction is smaller than the opening width in the Y axis direction.

Therefore, according to the surface emitting laser element 100 of the present embodiment, the stability of the output laser beam in the polarization direction can be increased without causing high cost, and the cross sectional shape of the output laser beam can be substantially circular.

In addition, according to the optical scanning device 1010 of the present embodiment, since the light source 14 includes the surface emitting laser element 100, high accurate optical scanning can be performed without causing high cost.

In addition, according to the laser printer 1000 of the present embodiment, since the laser printer 1000 includes the optical scanning device 1010, a high quality image can be formed without causing high cost.

In the above, a case is described in which the rectangular ratio of the current passing-through region 108b is 0.89 and the thickness of the oxidized layer 108a is non-uniform.

However, the case is not limited to the above in the present embodiment. For example, the present embodiment can be applied to a case in which the rectangular ratio of the current passing-through region 108b is 1.0 and the thickness of the oxidized layer 108a is non-uniform, and another case in which the rectangular ratio of the current passing-through region 108b is less than 1.0 and the thickness of the oxidized layer 108a is uniform. That is, in a case where a laser beam whose cross sectional shape is not square having a long length side is input to the light outputting section 115 via the oxide confinement structure, when the shape of the light outputting section 115 is suitably determined, the above effects can be obtained.

In the above, the oscillation wavelength of the surface emitting laser element 100 is in the 780 nm band. However, the oscillation wavelength of the surface emitting laser element 100 can be changed corresponding to the characteristics of the photoconductor body (photoconductor drum).

In addition, the surface emitting laser element 100 can be used in an apparatus other than the image forming apparatus. In this case, the oscillation wavelength can be in a 650 nm band, a 850 nm band, a 980 nm band, a 1.3 µm band, a 1.5 µm band, and so on depending on the intended use. In this case, as the semiconductor material for forming the active layer 105, a mixed crystal semiconductor material can be used corresponding to the oscillation wavelength.

For example, when the oscillation wavelength is in the 650 nm band, a mixed crystal semiconductor material based on AlGaInP can be used, when the oscillation wavelength is in the 980 nm band, a mixed crystal semiconductor material based on InGaAs can be used, and when the oscillation wavelength is in the 1.3 µm or 1.5 µm band, a mixed crystal semiconductor material based on GaInNAs(Sb) can be used.

In addition, when a material and a structure of each semiconductor DBR is selected corresponding to the oscillation wavelength, a surface emitting laser element corresponding to an arbitrary oscillation wavelength can be formed. As the material of the semiconductor DBR, a mixed crystal material based on AlGaInp other than the mixed crystal material based on AlGaAs can be used. It is desirable that the low and high refractive index layers are transmittable for the oscillation wavelength, and a refractive index difference between the low and high refractive index layers is as large as possible.

In addition, the shape of the light outputting section 115 of the surface emitting laser element 100 can be symmetrical for the axis which passes through the center of the light outputting section 115 and parallel to the Y axis direction, and can be asymmetrical for the axis which passes through the center of the light outputting section 115 and parallel to the X axis direction. At this time, the opening width of the light outputting section 115 at the +Y side can be greater than the opening width at the –Y side.

Figure 12A:
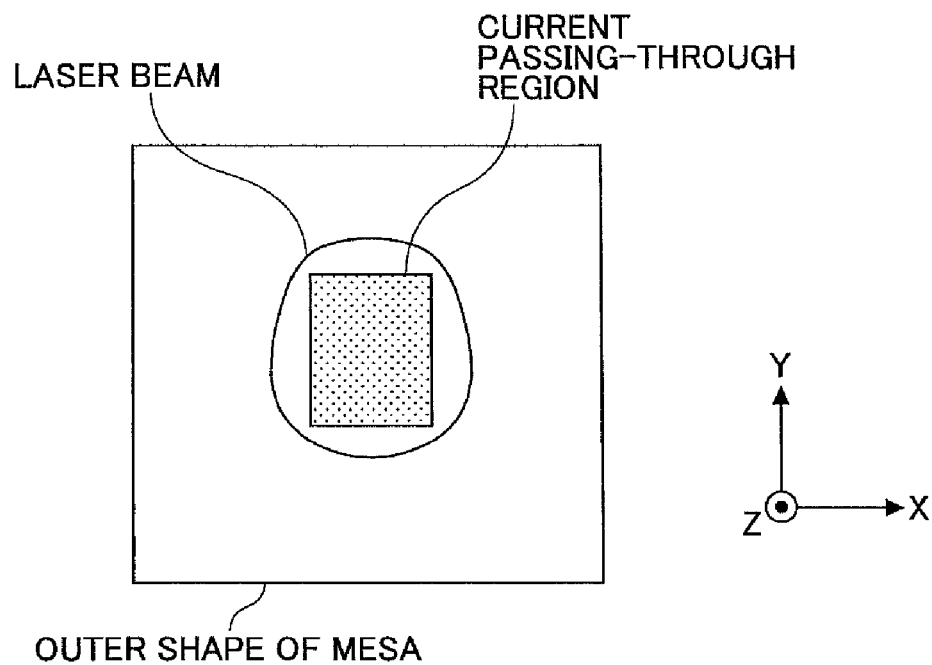
FIG. 12A is a diagram showing the shapes of a laser beam and the current passing-through region.

As described above, since the thickness of the oxidized layer 108a at the +Y side of the current passing-through region 108b is greater than the thicknesses at the other parts, the light confinement becomes great at the +Y side. Since asymmetry of the light confinement has a two-dimensional distribution, the shape of the laser beam becomes a slightly distorted eclipse shape. That is, the shape of the laser beam is slightly smaller at the +Y side and has an asymmetrical distortion in the Y axis direction (see FIG. 12A). FIG. 12A is a diagram showing the shapes of the laser beam and the current passing-through region 108b.

The distortion of the shape of the laser beam generates a beam intensity distribution which is asymmetrical for the X axis direction; therefore, when a laser beam emitted from a surface emitting laser element passes through an opening part of an aperture plate, the light amount distribution of the laser beams passed through the opening part becomes asymmetrical for the X axis direction. However, when it is adjusted that the opening width at the +Y side is greater than at the −Y side in the light outputting section, the distortion of the shape of the laser beam can be corrected.

Figure 12B:
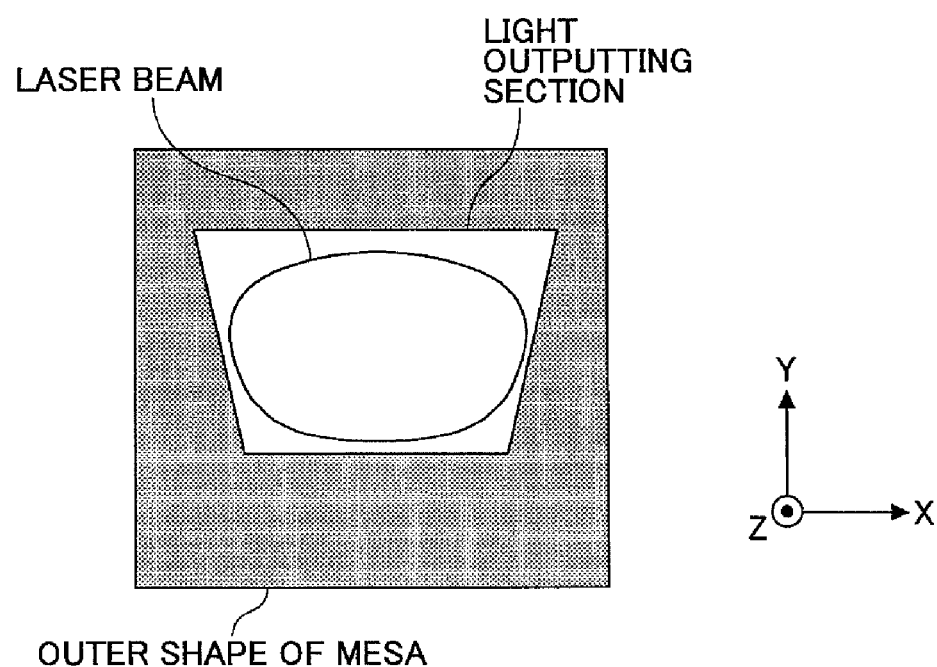
FIG. 12B is a diagram showing the shapes of a laser beam and the light outputting section.

A detailed distortion correction can be performed in principle by finely adjusting the shape of the light outputting section. However, actually, even if a rough correction is performed, a sufficient effect can be obtained. Therefore, as shown in FIG. 12B, the shape of the light outputting section 115 is preferably trapezoidal which can be easily designed and manufactured. FIG. 12B is a diagram showing the shapes of a laser beam and the light outputting section 115. In this case, at the light outputting section 115, the shape of the laser beam is slightly large in the +Y side, horizontally long, and has an asymmetrical distortion in the Y axis direction with the reflection of the distortion of the shape of the laser beam in the oxide confinement structure. In order to solve the above problem, when the shape of the light outputting section 115 is determined to be trapezoidal whose opening width is large at the +Y side, the shape of the laser beam can be approximately circular having a low distortion.

In the present embodiment, a case is described in which the thickness of the oxidized layer 108a at the +Y side of the current passing-through region 108b is greater than the other parts. That is, in this case, dy2>dy1, and dx2≈dx1>dy1. However, in another experiment by the inventors, a case exists in which dy2>dy1, and dy2>dx2≈dx1, depending on a combination of the thickness of the layer to be selectively oxidized 108 and oxidation conditions. In this case, it has been understood that the relationship between the rectangular ratio of the current passing-through region 108b and the polarization suppression ratio shown in FIG. 9 has an inverse relationship. However, even in this case, when the rectangular ratio of the current passing-through region 108b is determined to increase the polarization suppression ratio and the opening width of the light outputting section 115 is determined to be long for the long length direction of the laser beam to be input to the light outputting section 115, the shape of the laser beam can be a substantially circle.

Figure 13:
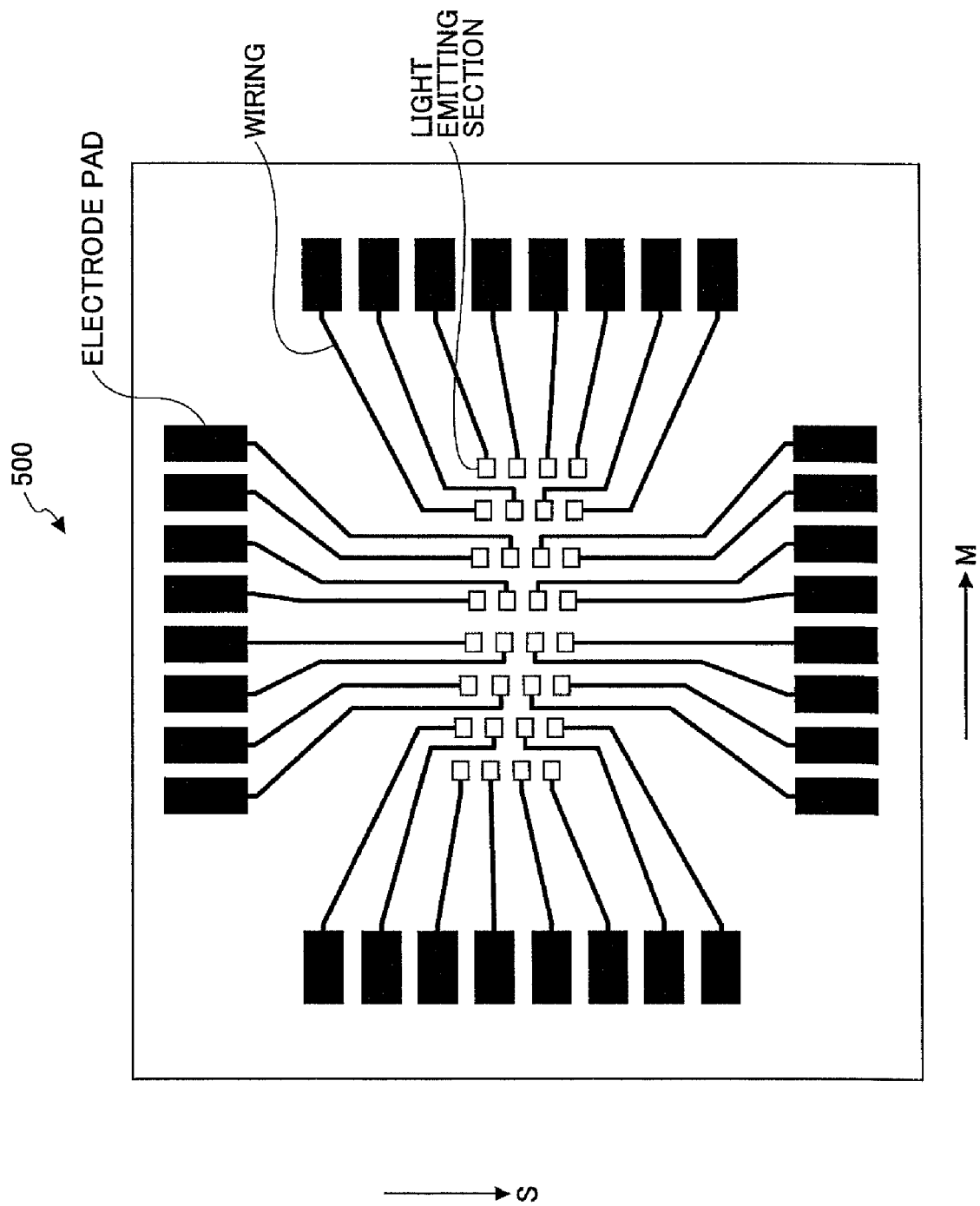
FIG. 13 is a diagram showing a surface emitting laser array according to the embodiment of the present invention.

FIG. 13 is a diagram showing a surface emitting laser array 500 according to the embodiment of the present invention.

The light source 14 in the optical scanning device 1010 shown in FIG. 2 can include the surface emitting laser array 500 shown in FIG. 13 instead of including the surface emitting laser element 100.

In the surface emitting laser array 500, plural light emitting sections are disposed on a substrate. In FIG. 13, 32 light emitting sections are disposed. In FIG. 13, the M direction is the main scanning corresponding direction and the S direction is the sub scanning corresponding direction. The number of the light emitting sections is not limited to 32, and can be less than 32 or more than 32.

Figure 14:
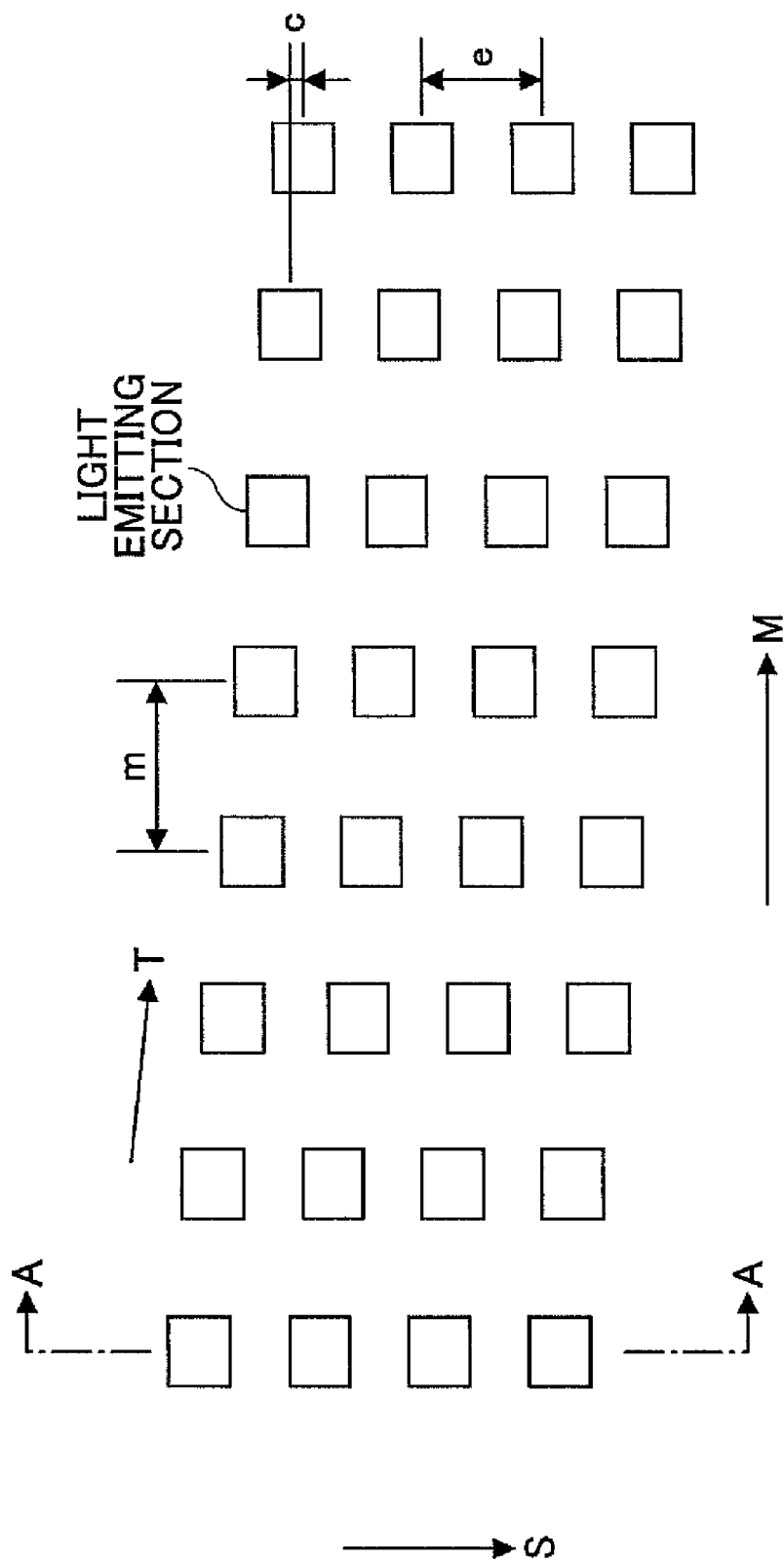
FIG. 14 is a diagram showing a two-dimensional array of light emitting sections shown in FIG. 13.

FIG. 14 is a diagram showing a two-dimensional array of the light emitting sections shown in FIG. 13. As shown in FIG. 14, the surface emitting laser array 500 includes four light emitting section arrays in which eight light emitting sections are disposed with the same interval between the light emitting sections in the T direction having a tilt angle from the M direction toward the S direction. The eight light emitting sections in one array are disposed so that the interval in the S direction between the centers of the eight light emitting sections is "c" and the four light emitting section arrays are disposed so that the interval in the S direction between the four light emitting section arrays is "e" (distance between the centers of the two light emitting section arrays). That is, the 32 light emitting sections are two-dimensionally arrayed.

In FIG. 14, the interval "c" is 3 μm, the interval "e" is 24 μm, and the interval "m" between the light emitting sections in the M direction is 30 μm.

Figure 15:
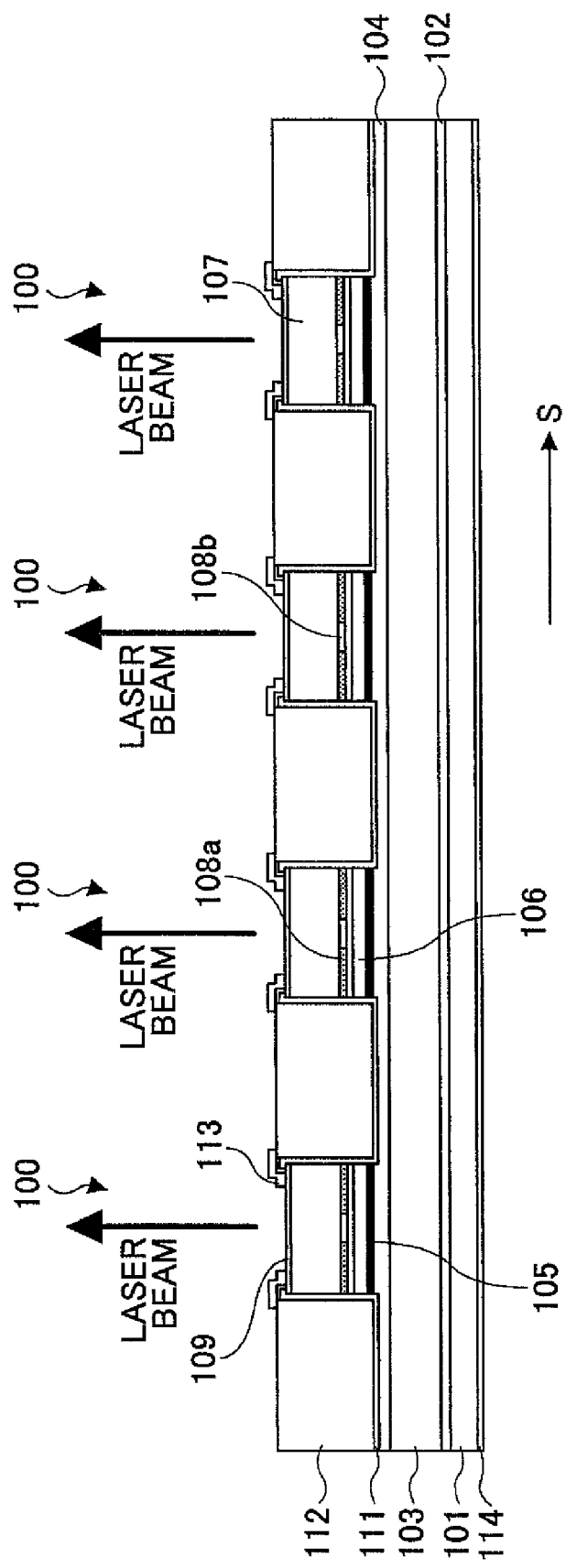
FIG. 15 is a cut-away side view along line A-A of FIG. 14.

FIG. 15 is a cut-away side view along line A-A of FIG. 14. As shown in FIG. 15, the light emitting section is the same as the surface emitting laser element 100. That is, the surface emitting laser array 500 can be manufactured by a method similar to the manufacturing method of the surface emitting laser element 100.

The surface emitting laser array 500 is formed of the surface emitting laser elements 100. Therefore, the surface emitting laser array 500 can have the same effects as the effects of the surface emitting laser element 100.

In the surface emitting laser array 500, the interval "c" between the light emitting sections is constant when each of the light emitting sections is normally projected on a virtual line extending in the sub scanning corresponding direction; therefore, when light emitting timing of the light emitting sections is adjusted, it can be said that the light emitting sections are arrayed with the same interval on the photoconductor drum 1030 in the sub scanning direction.

In addition, since the interval "c" is 3 μm, when the magnification of the optical system of the optical scanning device 1010 is determined to be approximately 1.8 times, high density writing of 4800 dpi (dot per inch) can be performed. When the number of the light emitting sections is increased in the main scanning corresponding direction, an array arrangement is performed in which the interval "c" is further decreased by narrowing the interval "e", or the magnification of the optical system is decreased; further high density writing can be performed, and higher quality printing can be performed. In addition, the writing interval in the main scanning direction can be easily controlled by adjusting the light emitting timing of the light emitting sections.

In this case, in the laser printer 1000, even if the writing dot density is increased, the printing can be performed without decreasing the printing speed. Further, when the writing dot density is not changed, the printing speed can be further increased.

In addition, in this case, the polarization directions of the laser beams (light fluxes) from the light emitting sections are stable and equal; therefore, the laser printer 1000 can stably form a high quality image.

In the surface emitting laser array 500, the distance (groove) between the two adjacent light emitting sections (the surface emitting laser elements 100) is preferably 5 μm or more so that the light emitting sections are electrically and spatially separated from each other. When the distance is too small, etching is not easily controlled when the surface emitting laser array 500 is manufactured. In addition, the size of the mesa (the length of one side) is preferably 10 μm or more. When the length is too short, heat stays inside the surface emitting array 500 and the characteristics may be lowered.

In addition, in a surface emitting laser array, surface emitting laser elements having a structure similar to the structure of the surface emitting laser elements 100 can be arrayed one-dimensionally.

In addition, in the present embodiment, the normal direction of the mirror polished surface (principal surface) of the substrate 101 is inclined by 15 degrees to the [1 1 1] A crystal orientation direction relative to the [1 0 0] crystal orientation direction. However, the normal direction of the mirror polished surface (principal surface) of the substrate 101 can be inclined by a degree other than 15 degrees in the [1 1 1] A crystal orientation direction relative to the [1 0 0] crystal orientation direction.

In addition, in the present embodiment, as the image forming apparatus, the laser printer 1000 is used; however, the image forming apparatus is not limited to the laser printer 1000, and can be an image forming apparatus including the optical scanning device 1010.

For example, in the present embodiment, as the image forming apparatus, an image forming apparatus can be used in which laser beams indicating corresponding colors are directly radiated onto a recording medium.

In addition, in the present embodiment, as the image forming apparatus, an image forming apparatus can be used in which a silver salt film is used as an image carrier. In this case, a latent image is formed on the silver salt film by optical scanning, and the latent image can be visualized by a developing process of a normal silver salt photographic process. Further, the visible image can be transferred onto photographic printing paper by a printing process of the normal silver salt photographic process. The image forming apparatus can be used as an optical reproduction apparatus or an optical image forming apparatus which shows a CT (computerized tomography) scanned image and so on.

Figure 16:
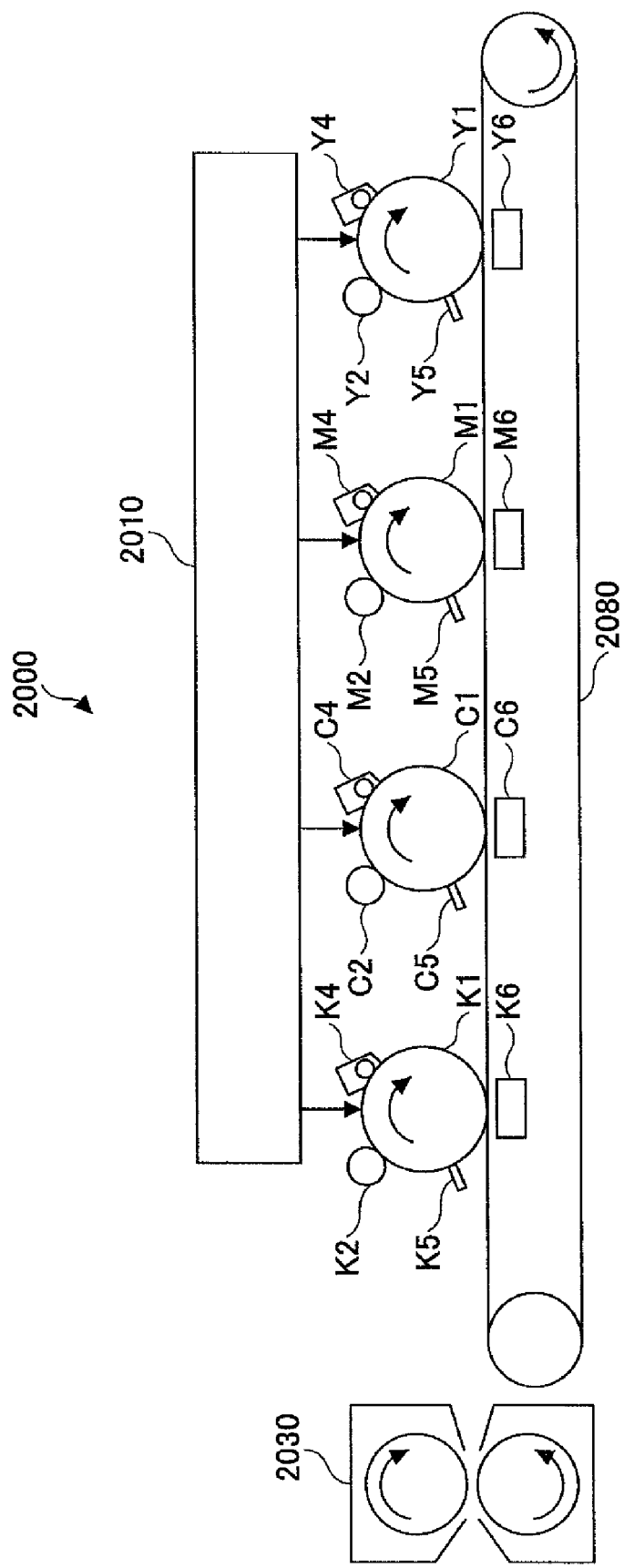
FIG. 16 is a cut-away side view of a color printer.
Figure 17A:
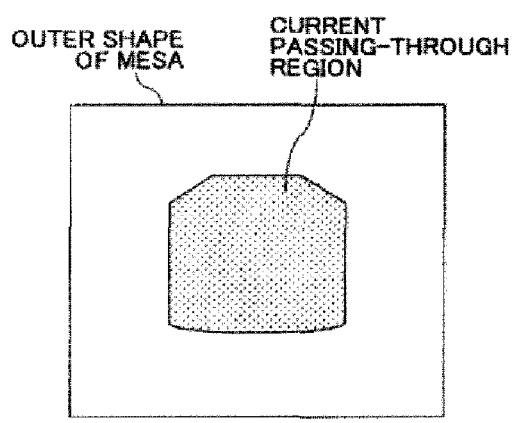
FIG. 17A is a diagram showing an outer shape of a mesa and a shape of a current passing-through region.
Figure 17B:
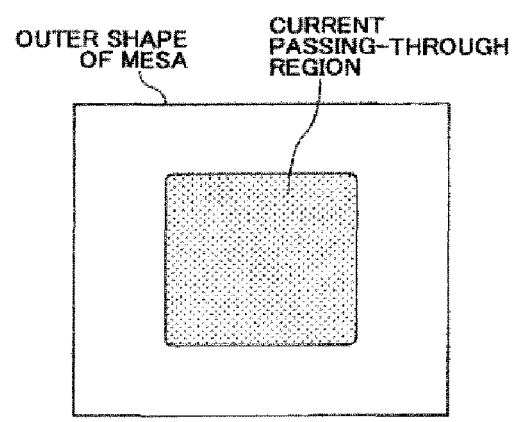
FIG. 17B is a diagram showing the outer shape of the mesa and a shape of a current passing-through region which is symmetrical for two axes.

In addition, as shown in FIG. 16, as the image forming apparatus, a color printer 2000 having plural photoconductor drums can be used FIG. 16 is a cut-away side view of the color printer 2000.

The color printer 2000 is a tandem type multiple color printer which forms a full color image by superposing four color images (black, cyan, magenta, and yellow images). The color printer 2000 includes a photoconductor drum K1, a charging device K2, a developing device K4, a cleaning unit K5, and a transfer device K6 for a black image; a photoconductor drum C1, a charging device C2, a developing device C4, a cleaning unit C5, and a transfer device C6 for a cyan image; a photoconductor drum M1, a charging device M2, a developing device M4, a cleaning unit M5, and a transfer device M6 for a magenta image; a photoconductor drum Y1, a charging device Y2, a developing device Y4, a cleaning unit Y5, and a transfer device Y6 for a yellow image; an optical scanning device 2010, a transfer belt 2080, a fixing unit 2030, and so on.

In the following, since the operations of the elements are the same in the four color images, the operations of the black image are described as representative.

The photoconductor drum K1 is rotated in the arrow direction shown in FIG. 16. The charging device K2, the developing device K4, the transfer device K6, and the cleaning unit K5 are sequentially disposed to surround the photoconductor drum K1 along the rotational direction of the photoconductor drum K1.

The charging device K2 uniformly charges the surface of the photoconductor drum K1. The optical scanning device 2010 radiates laser beams onto the surface of the photoconductor drum K1 charged by the charging device K2. With this, an electrostatic latent image is formed on the surface of the photoconductor drum K1. The developing device K4 develops the electrostatic latent image and forms a toner image on the surface of the photoconductor drum K1. The transfer device K6 transfers the toner image onto a recording medium (paper) on a transfer belt 2080, and the transferred image is fixed by the fixing unit 2030. When the above operations are performed for all color images, a full color image is printed on the recording medium.

The optical scanning device 2010 includes a light source similar to the light source 14 in each color. Therefore, the optical scanning device 2010 can obtain the same effects as those of the optical scanning device 1010. In addition, since the color printer 2000 includes the optical scanning device 2010, the color printer 2000 can obtain the same effects as those of the laser printer 1000.

In the color printer 2000, a color registration error may be generated due to a manufacturing error of each component and a positioning error of the component. However, in a case where each of the light sources of the optical scanning device 2010 includes a surface emitting laser array similar to the surface emitting laser array 500, when a light emitting section to be lighted is selected, the color registration error can be decreased.

As described above, according to the embodiment of the present invention, in the surface emitting laser element 100 and the surface emitting laser array 500, the stability of the output laser beam in the polarization direction can be high and the cross sectional shape of the output laser beam can be substantially circular without causing high cost. In addition, in the optical scanning device 1010 (2010), accurate optical scanning can be performed without causing high cost. In addition, the image forming apparatus 1000 (2000) can form a high quality image without causing high cost Further, the present invention is not limited to the specifically disclosed embodiment, and variations and modifications may be made without departing from the scope of the present invention The present invention is based on Japanese Priority Patent Application No. 2008-1533B2, filed on Jun. 11, 2008, and Japanese Priority Patent Application No. 2009-092551, filed on Apr. 7, 2009, with the Japanese Patent Office, the entire contents of which are hereby incorporated herein by reference

What is claimed is:

1. A surface emitting laser element, comprising:
a substrate whose normal direction of a principal surface is inclined to one direction of a [1 1 1] crystal orientation relative to one direction of a [1 0 0] crystal orientation;
a resonator structural body including an active layer, a lower spacer layer and an upper spacer layer, wherein the active layer is at a center of the resonator structural body, the center corresponding to an anti-node position of a standing wave distribution of an electric field, and wherein a center part of the lower spacer layer forms a base of a mesa structure;
first and second semiconductor distributed Bragg reflectors which sandwich the resonator structural body and include a confinement structure in which a current passing-through region is surrounded by an oxidized layer;
a plurality of semiconductor layers stacked on the substrate; and
a metal layer having an opening part which becomes a light outputting section on the plural semiconductor layers, wherein
a laser beam whose cross sectional shape has a long length direction is input to the metal layer via the oxide confinement structure; and
an opening width of the light outputting section in a first direction orthogonal to the long length direction of the laser beam is smaller than another opening width of the light outputting section in a second direction parallel to the long length direction of the laser beam.

2. A surface emitting laser element, comprising:
a substrate whose normal direction of a principal surface is inclined to one direction of a [1 1 1] crystal orientation relative to one direction of a [1 0 0] crystal orientation;
a resonator structural body including an active layer;
first and second semiconductor distributed Bragg reflectors which sandwich the resonator structural body and include a confinement structure in which a current passing-through region is surrounded by an oxidized layer;
a plurality of semiconductor layers stacked on the substrate; and
a metal layer having an opening part which becomes a light outputting section on the plural semiconductor layers, wherein
a laser beam whose cross sectional shape has a long length direction is input to the metal layer via the oxide confinement structure; and
an opening width of the light outputting section in a first direction orthogonal to the long length direction of the laser beam is smaller than another opening width of the light outputting section in a second direction parallel to the long length direction of the laser beam, and wherein:
a length of the current passing-through region in the first direction is greater than a length of the current passing-through region in the second direction.

3. A surface emitting laser element comprising:
a substrate whose normal direction of a principal surface is inclined to one direction of a [1 1 1] crystal orientation relative to one direction of a [1 0 0] crystal orientation;
a resonator structural body including an active layer;
first and second semiconductor distributed Bragg reflectors which sandwich the resonator structural body and include a confinement structure in which a current passing-through region is surrounded by an oxidized layer;
a plurality of semiconductor layers stacked on the substrate; and
a metal layer having an opening part which becomes a light outputting section on the plural semiconductor layers, wherein
a laser beam whose cross sectional shape has a long length direction is input to the metal layer via the oxide confinement structure; and
an opening width of the light outputting section in a first direction orthogonal to the long length direction of the laser beam is smaller than another opening width of the light outputting section in a second direction parallel to the long length direction of the laser beam, and wherein:
a thickness of the oxidized layer surrounding the current passing-through region is greater in one of the directions parallel to the second direction than in the direction parallel to the first direction.

4. The surface emitting laser element as claimed in claim 3, wherein:
a shape of the light outputting section of the metal layer is symmetrical for an axis parallel to the second direction passing through a center of the light outputting section, and asymmetrical for an axis parallel to the first direction passing through the center of the light outputting section; and
the opening width of the light outputting section corresponding to a part where the thickness of the oxidized layer surrounding the current passing-through region is greater than the other parts is greater than the other opening width of the light outputting section.

5. The surface emitting laser element as claimed in claim 1, wherein:
the first direction is parallel to a surface of the substrate, and orthogonal to one direction of the [1 0 0] crystal orientation and one direction of the [1 1 1] crystal orientation; and
the second direction is a direction orthogonal to the normal direction of the principal surface of the substrate and the first direction.

6. The surface emitting laser element as claimed in claim 1, wherein:
a shape of the current passing-through region is symmetrical for a first axis parallel to the first direction passing through the center of the current passing-through region and symmetrical for a second axis parallel to the second direction passing through the center of the current passing-through region.

7. The surface emitting laser element as claimed in claim 1, wherein:
the first direction is parallel to a polarization direction of an output laser beam.

8. The surface emitting laser element as claimed in claim 1, wherein:
the normal direction of the principal surface of the substrate is inclined to the [1 1 1] A crystal orientation direction relative to the [1 0 0] crystal orientation direction; and
the direction parallel to the first direction is the [0 −1 1] crystal orientation direction and the [0 1 −1] crystal orientation direction.

9. A surface emitting laser array, comprising:
a plurality of the surface emitting laser elements as claimed in claim 1.

10. An optical scanning device which scans a surface to be scanned by a laser beam, comprising:
a light source which includes the surface emitting laser element as claimed in claim 1;
a deflecting unit which deflects the laser beam from the light source; and
a scanning optical system which condenses the laser beam deflected by the deflecting unit onto the surface to be scanned.

11. An optical scanning device which scans a surface to be scanned by a laser beam, comprising:
a light source which includes the surface emitting laser array as claimed in claim 9;
a deflecting unit which deflects the laser beam from the light source; and
a scanning optical system which condenses the laser beam deflected by the deflecting unit onto the surface to be scanned.

12. An image forming apparatus, comprising:
at least one image carrier; and
the optical scanning device as claimed in claim 10 which scans the laser beam including image information onto the image carrier.

13. An image forming apparatus, comprising:
at least one image carrier; and
the optical scanning device as claimed in claim 11 which scans the laser beam including image information onto the image carrier.

14. The image forming apparatus as claimed in claim 12, wherein:
the image information is multiple color image information.

15. The image forming apparatus as claimed in claim 13, wherein:
the image information is multiple color image information.

16. The surface emitting laser element as claimed in claim 1, wherein a thickness of the oxidized layer surrounding the current passing-through region is greater in one of the directions parallel to the second direction than in the direction parallel to the first direction.

17. The surface emitting laser element as claimed in claim 1, wherein a thickness of the oxidized layer surrounding the current passing-through region is non-uniform.

* * * * *